(12) United States Patent
Ni et al.

(10) Patent No.: US 12,523,934 B2
(45) Date of Patent: Jan. 13, 2026

(54) APPARATUS AND METHOD FOR CALIBRATING A FLUID DISPENSER

(71) Applicant: CANON KABUSHIKI KAISHA, Tokyo (JP)

(72) Inventors: Qi Ni, Pflugerville, TX (US); James W. Irving, Austin, TX (US); Ahmed M. Hussein, Pflugerville, TX (US); Craig William Cone, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 18/530,767

(22) Filed: Dec. 6, 2023

(65) Prior Publication Data

US 2025/0189899 A1 Jun. 12, 2025

(51) Int. Cl.
*B41J 2/045* (2006.01)
*B82Y 40/00* (2011.01)
(Continued)

(52) U.S. Cl.
CPC ........ *G03F 7/2018* (2013.01); *B41J 2/04535* (2013.01); *B41J 2/0459* (2013.01); *B41J 2/04593* (2013.01); *B82Y 40/00* (2013.01); *G03F 7/0002* (2013.01); *G03F 7/7035* (2013.01); *G03F 7/70466* (2013.01); *G03F 7/70666* (2013.01); *G06T 7/0004* (2013.01); *B05C 5/0279* (2013.01); *B41J 2/04581* (2013.01); *B41J 2/04586* (2013.01);
(Continued)

(58) Field of Classification Search
CPC .... G03F 7/2018; G03F 7/0002; G03F 7/7035; G03F 7/70466; G03F 7/70666; B41J 2/04535; B41J 2/0459; B41J 2/04593; B41J 2/04581; B41J 2/04586; B41J 2/205; B41J 2/2132; B82Y 40/00; G06T 7/0004; B05C 5/0279; G01B 11/06; H01L 21/6715; H01L 21/67253
See application file for complete search history.

(56) References Cited

U.S. PATENT DOCUMENTS 7,602,960 B2 * 10/2009 Bartov ............... G01N 21/9501
216/85
9,724,916 B2 * 8/2017 Kodama ............... B82Y 10/00
(Continued)

FOREIGN PATENT DOCUMENTS

JP 2022002240 A 1/2022

*Primary Examiner* — Yaovi M Ameh
(74) *Attorney, Agent, or Firm* — Canon U.S.A., Inc. IP Division

(57) ABSTRACT

Systems and methods are provided for adjusting a fluid dispenser for depositing drops of formable material. According to embodiments, a system obtains an image of a substrate including a film formed on the substrate by curing the formable material deposited by a first dispenser and a second dispenser. Intensity information is obtained for pixels of the image and a difference is determined between intensity values from a portion of the substrate on which the first dispenser deposited drops and intensity values from a portion on which the second dispenser deposited drops, the intensity values corresponding to a region of the substrate associated with a target thickness. Adjustments based on the intensity values are made to change a drop volume and a drop density for nozzles of the first dispenser and nozzles of the second dispenser.

19 Claims, 22 Drawing Sheets

(51) Int. Cl.
    *G01B 11/06*     (2006.01)
    *G03F 7/00*     (2006.01)
    *G03F 7/20*     (2006.01)
    *G06T 7/00*     (2017.01)
    *B05C 5/02*     (2006.01)
    *B41J 2/205*     (2006.01)
    *B41J 2/21*     (2006.01)
    *H01L 21/67*     (2006.01)

(52) U.S. Cl.
    CPC .............. *B41J 2/205* (2013.01); *B41J 2/2132* (2013.01); *G01B 11/06* (2013.01); *H01L 21/6715* (2013.01); *H01L 21/67253* (2013.01)

(56) References Cited

U.S. PATENT DOCUMENTS

| | | |
|---|---|---|
| 2016/0275671 A1 | 9/2016 | Li et al. |
| 2021/0132491 A1* | 5/2021 | Thompson ............ H01L 21/027 |

* cited by examiner

APPARATUS AND METHOD FOR CALIBRATING A FLUID DISPENSER

FIELD

The present disclosure relates to semiconductor device fabrication, and more particularly, to adjustments in dispensing drops of formable material for inkjet-based adaptive planarization.

BACKGROUND

Nano-fabrication includes the fabrication of very small structures that have features that are 100 nanometers (nm) or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography (NIL). Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, optical components, and the like.

Some nanoimprint lithography techniques form a feature pattern in a formable material (polymerizable) layer and transfer a pattern corresponding to the feature pattern into or onto an underlying substrate. The patterning process uses a shaping surface of a template (having recesses and protrusions) spaced apart from the substrate, and a formable liquid is applied between the template and the substrate. The formable liquid is solidified to form a solid layer that has a pattern conforming to the shaping surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) that is based on the nanoimprint lithography technique involves dispensing a variable drop pattern of formable (polymerizable) material between the substrate and a superstrate (a template with no features), where the drop pattern varies depending on the substrate's relief pattern. A shaping surface of the superstrate is then brought into contact with the formable material, after which the material is polymerized (cured) on the substrate, and the superstrate removed.

Various lithographic patterning techniques benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL), planarization improves feature filling and CD control after pattern transfer.

And a substrate with polymerized material can be further subjected to known semiconductor procedures and processes for device (article) fabrication, including, for example, curing, oxidation, layer formation, deposition, doping, planarization, etching, formable material removal, dicing, bonding, packaging, and the like.

In a planarization process or nanoimprinting patterning process, discrepancies may develop between drops of formable material deposited onto a substrate and target values for the drops of formable material. Small variations in drop volume in drops deposited by a dispenser can manifest as thickness variation in a film formed on a substrate.

SUMMARY

Some embodiments of the present disclosure provide a system for adjusting a fluid dispenser that dispenses drops of formable material in a nanoimprint lithography system. According to some embodiments, a system is provided which includes a substrate chuck configured to hold a substrate, a light source configured to provide light to formable material on the substrate, a camera positioned to receive light from the formable material on the substrate, and a plurality of fluid dispensers.

Some embodiments of the present disclosure include one or more processors and one or more memories configured to cause a system to obtain an image of a substrate including a film, the film formed on the substrate by curing formable material deposited on the substrate by a first dispenser and a second dispenser. The first dispenser deposits drops of the formable material on a first portion of the substrate from a group of nozzles of the first dispenser based on a target volume. The second dispenser deposits drops of the formable material on a second portion of the substrate from a group of nozzles of the second dispenser based on the target volume, the second portion of the substrate different from the first portion of the substrate. The system obtains intensity information for pixels of the image of the substrate, the intensity information including first intensity data corresponding to the first portion of the substrate and second intensity data corresponding to the second portion of the substrate. The system determines a difference between first intensity values corresponding to a region of the substrate and second intensity values corresponding to the region of the substrate, the first intensity values being intensity values of the first intensity data, the second intensity values being intensity values of the second intensity data. The region of the substrate corresponding to the first intensity values and the second intensity values is associated with a target thickness for the film on the substrate. The difference between the first intensity values and the second intensity values may exceed a threshold. A first adjustment amount for the group of nozzles of the first dispenser is determined based on the first intensity values and a second adjustment amount for the group of nozzles of the second dispenser is determined based on the second intensity values. One or both of a drop volume and a drop density may be adjusted for the group of nozzles of the first dispenser based on the first adjustment amount and one or both of a drop volume and a drop density may be adjusted for the group of nozzles of the second dispenser based on the second adjustment amount.

Further features of the present disclosure will become apparent from the following description of exemplary embodiments with reference to the attached drawings, in which like reference characters designate the same or similar parts throughout the figures thereof.

DETAILED DESCRIPTION

Figure 1:
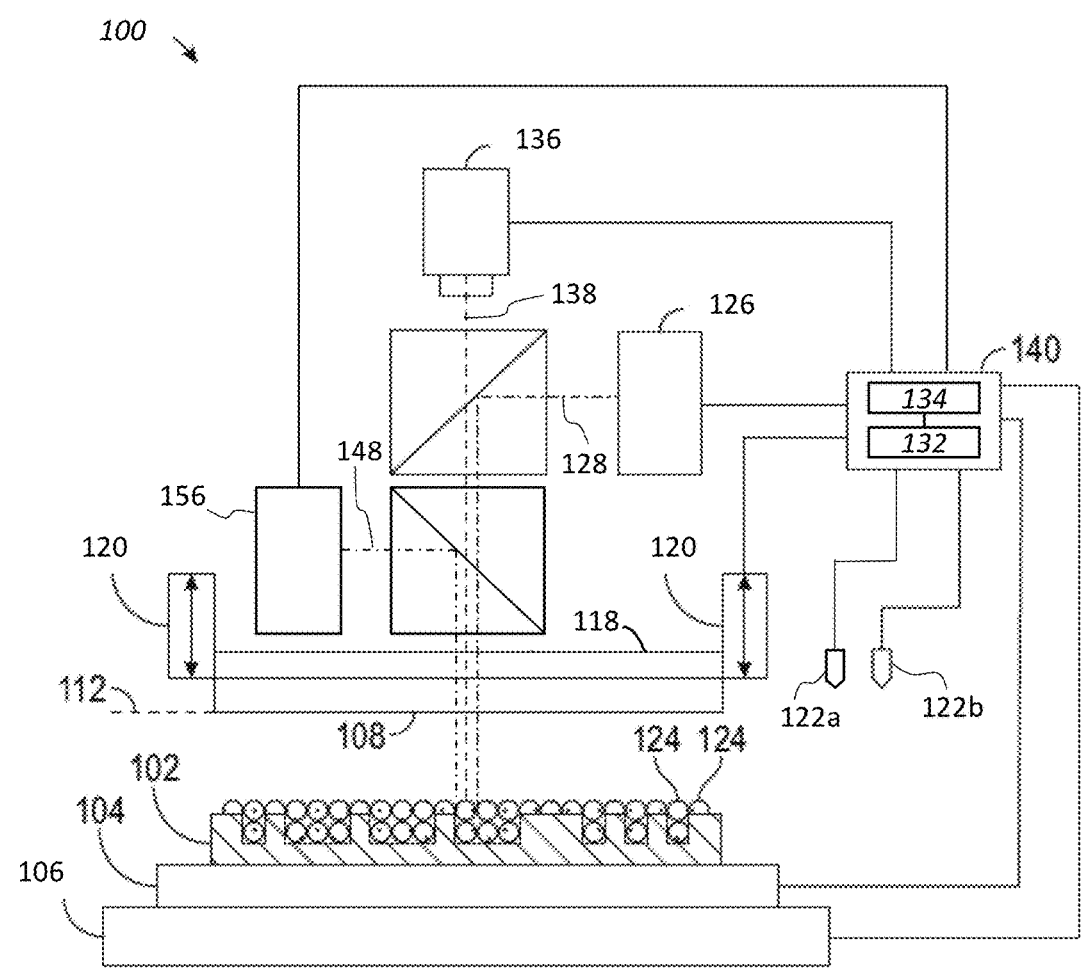
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments. Also, as used herein, the conjunction "or" generally refers to an inclusive "or," although "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, a fluid dispenser in a group of fluid dispensers may be identified with the reference numeral 122 when a particular fluid dispenser is not being distinguished. However, 122*a* or 122*b*, for example, may be used to identify a specific fluid dispenser when the specific fluid dispenser is being distinguished from the rest of the fluid dispensers 122.

According to some embodiments, multiple fluid dispensers are used to deposit drops of liquid formable material onto the substrate in a planarization technique, such as IAP techniques. When a superstrate contacts the formable material deposited on the substrate, the drops of formable material merge to form a formable material film. While the superstrate is in contact with the formable material film, the formable material film is cured to form a layer on the substrate. When multiple fluid dispensers are used, small variations of drop volume in each dispenser can manifest as an overburden thickness variation across the wafer and affect the process. Overburden thickness may be measured by ellipsometer. In some cases, the process of measurement by ellipsometer may require transporting the processed wafer to a dedicated measuring tool, which may be time consuming and burdensome. According to embodiments of the present disclosure, a nanoimprint lithography system uses a camera, for example, a spread camera, included in the system to enable the capture and process of images for the whole wafer and output the resulting overburden layer thickness for process control.

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and yp-axes. The substrate positioning stage 106, the substrate 102, and the substrate chuck 104 may also be positioned on a base (not shown). The substrate positioning stage 106 may be a part of a positioning system.

Spaced apart from the substrate 102 is a superstrate 108 having a working surface 112 facing the substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 102. Surface 112 of superstrate 108 can include a planar contact surface. In another embodiment, the contact surface of the superstrate (sometimes called a template) can include features that define any original pattern that forms the basis of a pattern to be formed on the substrate 102. In an embodiment, the superstrate is substantially the same size as the substrate and is used to shape a film on the whole substrate. In an embodiment, the superstrate is smaller than the substrate and is used in a step and repeat manner to shape a film on the substrate.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck 118 is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform.

The superstrate chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The nanoimprint lithography system 100 may further include fluid dispensers 122a, 122b. The fluid dispensers 122a, 122b may also be moveably coupled to the bridge. In an embodiment, the fluid dispensers 122a and 122b are separate physical dispensers. In an embodiment, the fluid dispenser 122a is a first subset of nozzles, the fluid dispenser 122b is a second subset of nozzles, and the first subset of nozzles and the second subset of nozzles are on a single fluid dispenser. In an embodiment, the fluid dispensers 122a, 122b and the head 120 share one or more or all positioning components. In an alternative embodiment, the fluid dispensers 122a, 122b and the head 120 move independently from each other. The fluid dispensers 122a, 122b may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102.

In positioning the dispensers 122a, 122b, the one or more processors 132 may cause one or both of the substrate positioning stage 106 and/or a dispenser positioning stage to move an imprint field of the substrate 102 to a fluid dispense position below the fluid dispensers 122a, 122b. The substrate 102, may be divided into multiple imprint fields. To dispense formable material, the one or more processors 132 may cause the fluid dispensers 122a, 122b to dispense formable material onto an imprint field. In an embodiment, the fluid dispensers 122a, 122b dispense the formable material 124 as a plurality of droplets. The fluid dispensers 122a, 122b may include one nozzle or multiple nozzles. The fluid dispensers 122a, 122b may eject formable material 124 from the one or more nozzles simultaneously. Each of the fluid dispensers 122a, 122b may dispense formable material onto the substrate during two or more passes. The fluid dispensers 122a, 122b may dispense formable material onto the substrate during a single pass. In some embodiments, the fluid dispensers 122a, 122b alternate effecting drops during successive passes. The imprint field may be moved relative to the fluid dispensers 122a, 122b while the fluid dispensers are ejecting formable material 124. In some embodiments, the formable material 124 is dispensed onto a substrate in accordance with a drop pattern. The drop pattern may include information such as one or more of position to deposit drops of formable material, the volume of the drops of formable material, type of formable material, and the shape parameters of the drops of formable material. In an embodiment, a substrate is placed on a first substrate chuck on a first substrate stage, the fluid is dispensed onto the substrate on the first substrate chuck, and the substrate is then placed on a second substrate chuck on a second substrate stage that is underneath the superstrate chuck.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 further comprises a curing system that includes a radiation source 126 that directs actinic energy, for example, UV radiation, along an exposure path 128. The head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124. In an embodiment, the actinic radiation passes through the superstrate chuck or a hole in the superstrate chuck. In an embodiment, the superstrate is released from the superstrate chuck prior to actinic radiation passing through the superstrate. In an embodiment, a multilayer stack including planarized layer 146 between the superstrate and substrate is moved from underneath the superstrate chuck to a curing module where it is exposed to actinic radiation.

The nanoimprint lithography system 100 further comprises a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the nanoimprint lithography system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface. The camera 136 may be configured to detect non-UV light (for example visible light 400 nm-700 nm). The camera 136 may be a monochromatic camera. According to some embodiments, the camera 136 is configured to capture grayscale images of the substrate 102. In some embodiments, the camera 136 captures an image and converts the image to a grayscale image by image processing, such as converting RGB (Red Green Blue) values to grayscale using the NTSC (National Television Standards Committee) formula: $(0.299 \cdot Red + 0.587 \cdot Green + 0.114 \cdot Blue)$, or other technique for generating grayscale images.

The nanoimprint lithography system 100 may further include a thermal radiation source 156 which may be configured to provide a spatial distribution of thermal radiation to one or both of the superstrate 108 and the substrate 102. The thermal radiation source 156 may include one or more sources of thermal electromagnetic radiation that will heat up one or more of the substrate 102, the formable material 124, and the superstrate 108 and does not cause the formable material 124 to solidify. In some embodiments, the wavelength of the heat irradiation is a non-UV wavelength. In some embodiments, a filter between the camera and substrate filters out UV light. The thermal radiation source 156 emits light that has a wavelength to which the formable material 124, as an ultraviolet curing resin material, is not photosensitive (not cured), for example, light in a wavelength band of 400 nm to 2,000 nm. For heating efficiency, some embodiments of the thermal radiation source 156 emit light in a wavelength band of 500 nm to 800 nm. In some embodiments, the wavelength of the heat irradiation is infrared radiation (wavelength 750 nm-1000 μm). In some embodiments, the wavelength of the infrared radiation is tuned so as to be absorbed by one or both of superstrate 108 and/or the substrate 102 and not the formable material 124. However, some embodiments of the thermal radiation source 156 emit light in other wavelength bands. Also, in some embodiments, the thermal radiation source 156 is a laser, such as a high-power laser. The thermal radiation source 156 may include a spatial light modulator such as a digital micromirror device (DMD), Liquid Crystal on Silicon (LCoS), Liquid Crystal Device (LCD), etc., to modulate the spatial temporal distribution of thermal radiation.

The nanoimprint lithography system may further comprise one or more optical components which are used to combine the actinic radiation, the thermal radiation, and the radiation gathered by the field camera 136 onto a single optical path that intersects with the imprint field when the superstrate 108 comes into contact with the formable material 124 on the substrate 102. The thermal radiation source 156 may send the thermal radiation along a thermal radiation path 148 after the superstrate 108 has made contact with the formable material 128. FIG. 1 illustrates the thermal radiation path 148 when the superstrate 108 is not in contact with the formable material 124, this is done for illustrative purposes so that the relative position of the individual components can be easily identified. An individual skilled in the art would understand that the thermal radiation path 148 would not substantially change when the superstrate 108 is brought into contact with the formable material 124. In FIG. 1 the thermal radiation path 148 is shown terminating at the substrate 102. In some embodiments, grayscale images are captured using two different intensity light sources. In some embodiments, grayscale images are captured using two different wavelengths light.

The nanoimprint lithography system 100 may be regulated, controlled, or directed by one or more processors 132 (e.g., controllers) in communication with one or more other components or subsystems, such as the substrate positioning stage 106, the fluid dispenser 122, the radiation source 126, or the camera 136, and may operate based on instructions in a computer-readable program stored in one or more computer-readable storage media 134. In some embodiments, including the embodiment in FIG. 1, the one or more processors 132 and the one or more computer-readable storage media 134 are included in a lithography-control device 140. The lithography-control device 140 regulates, controls, or directs the operations of the nanoimprint lithography system 100.

Each of the one or more processors 132 may be or may include one or more of the following: a central processing unit (CPU), which may include a microprocessor (e.g., a single core microprocessor, a multi-core microprocessor), a graphics processing unit (GPUs), an application-specific integrated circuit (ASIC), a field-programmable-gate array (FPGA), a digital signal processor (DSP), and other electronic circuitry (e.g., other integrated circuits). For example, a processor 132 may be a purpose-built controller or may be a general-purpose controller that has been specially-configured to be an imprint-system controller.

Examples of computer-readable storage media 134 include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

Furthermore, the lithography-control device 140 may operate as a drop-pattern-generation device, which generates one or more drop patterns (dispense patterns). And the lithography-control device 140 may obtain the one or more drop patterns from another device (e.g., a drop-pattern-generation device). For example, the one or more processors 132 may be in communication with a networked computer (e.g., a drop-pattern-generation device) on which analysis is performed and control files, such as drop patterns, are generated. A drop pattern indicates where the fluid dispenser 122 should deposit drops of liquid formable material 124 onto the substrate 102. A drop pattern may be generated based, at least in part, on a field volume or on imprint-field features. Also, to account for imprint-field features in the substrate, superstrate and/or template, the drop density of the drop pattern may vary across the substrate. And the drop pattern may have a uniform drop density over regions of the imprint field that have a uniform density (e.g., blank areas, or areas where the imprint-field features have a uniform feature density). Drop pattern generation software generates a drop pattern based on one or more of: the drop volume, the substrate topography, superstrate topography, and other process conditions. Drop pattern generation software is described in, for example, U.S. Pat. No. 11,402,749, which is hereby incorporated by reference.

Either the head 120, the substrate positioning stage 106, or both varies a distance between the superstrate 108 and the substrate 102 to define a desired space (a bounded physical extent in three dimensions) that is filled with the formable material 124. For example, the head 120 may apply a force to the superstrate 108 such that superstrate 108 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link, conforming to a shape of the substrate surface and the surface 112 of the superstrate 108. The formable material 124 is cured while the superstrate 108 is in contact with formable material 124 forming the planarized layer on the substrate 102. Thus, the nanoimprint lithography system 100 uses an imprinting process to form the planar layer with a featureless patterning surface 112. In an alternative embodiment, the superstrate is a template with features that are used to form features in formable material on the substrate.

Figure 2A:
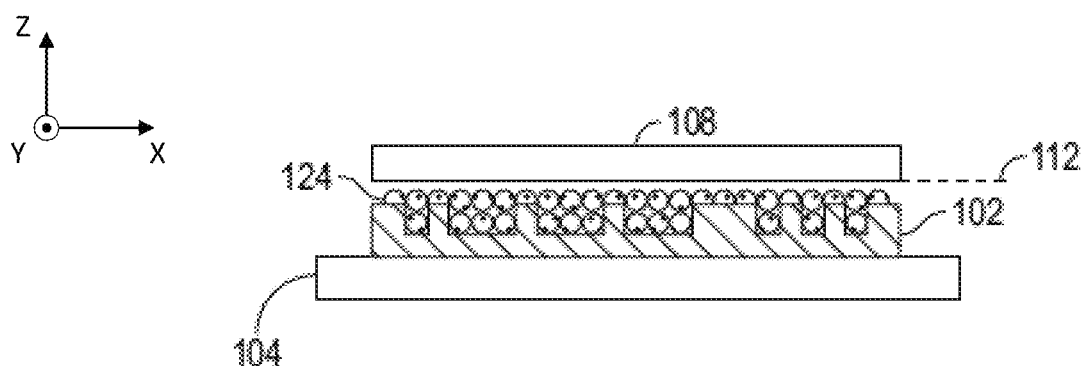
FIGS. 2A to 2C illustrate an example planarization process.
Figure 2B:
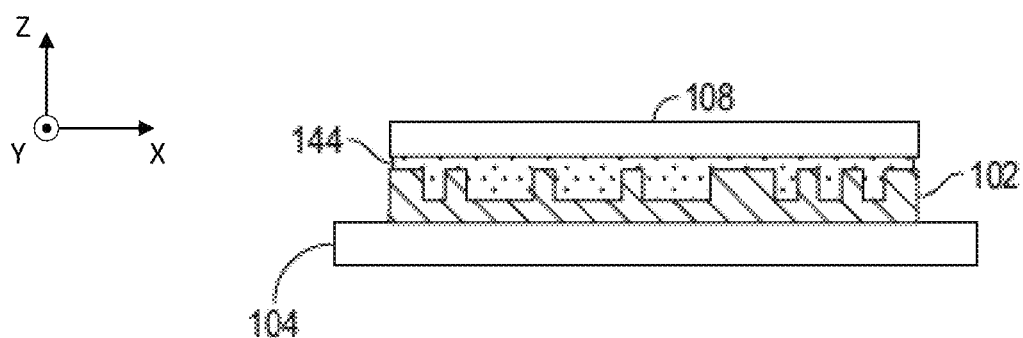
Figure 2C:
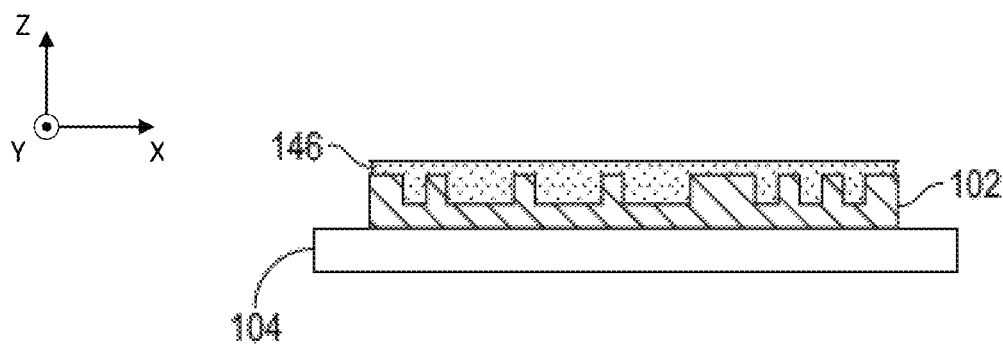

FIGS. 2A to 2C illustrate a planarization process according to some embodiments of the present disclosure. The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography and/or template topography. The superstrate 108 is then positioned in contact with the formable material 124. The superstrate 108 has a working surface 112 facing and spaced apart from the substrate 102.

FIG. 2B illustrates a post-contact step after the superstrate 108 has been brought into full contact with the formable material 124 but before a polymerization process (curing) starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., ultraviolet (UV) radiation). For example, a radiation source can provide the actinic radiation causing formable material film 144 to cure, solidify, and/or cross-link, defining a cured planarized layer 146 on the substrate 102 or a cured formable material layer (in the case in which a template is used). Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108. According to some embodiments, the formable material between the substrate and the superstrate forms a planarized layer on the substrate upon receiving the light provided by a plurality of light sources. According to some embodiments, the formable material between the substrate and the superstrate forms a planarized layer on the substrate upon receiving the light provided by a single light source where the light is polarized light in at least two orthogonal directions.

Figure 3:
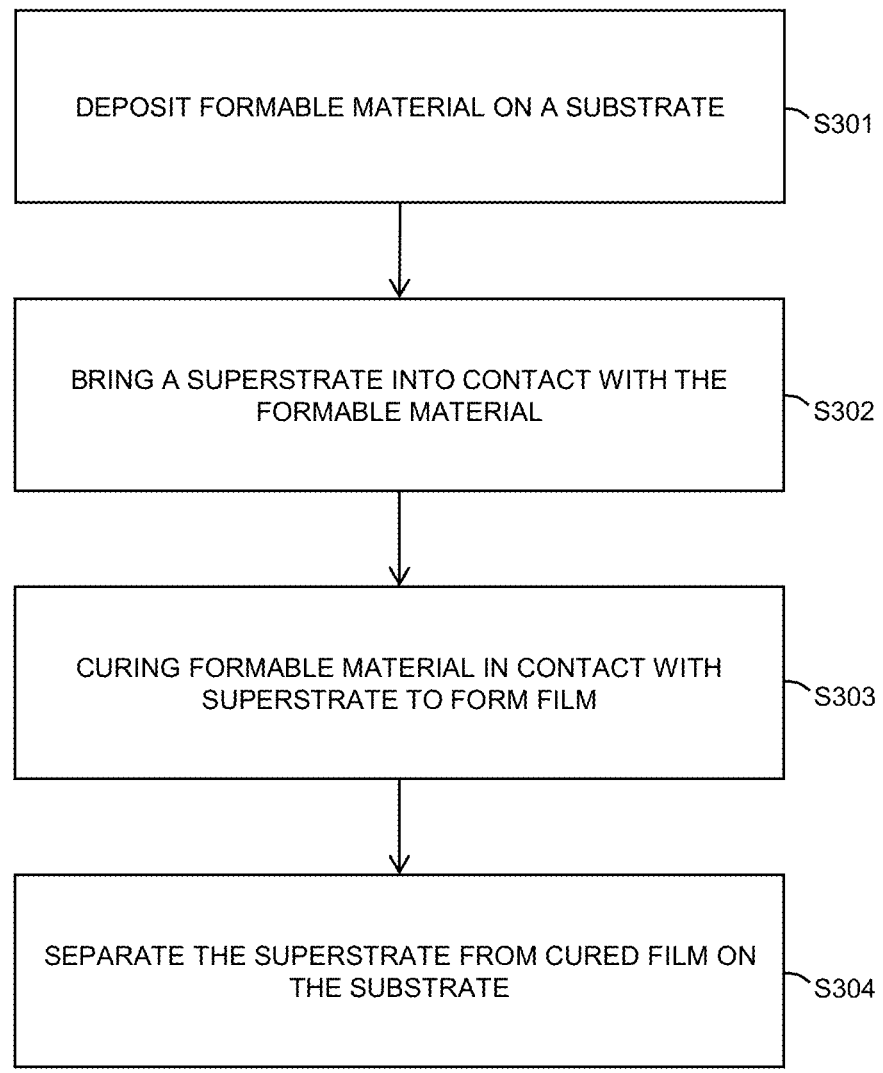
FIG. 3 illustrates an operational flow of an example planarization method according to some embodiments of the present disclosure.

FIG. 3 illustrates an operational flow of an example planarization method according to some embodiments of the present disclosure. In step S301, a formable material is deposited on a substrate, such as the substrate 102. The formable material may be a curable material deposited on the substrate. The formable material dispensed onto the substrate 102 may be dispensed in the form of droplets.

In step S302, the substrate 102 having the formable material 124 is planarized using the head 120 to form a multilayered structure. As noted above, using the positioning system, the head 120 may be moved toward the substrate 102 to apply a force to the superstrate 108 such that the superstrate 108 contacts and spreads droplets of the formable material 124. FIG. 2B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. In some embodiments, the superstrate 108 and/or the substrate 102 is supported by a controlled back pressure from the substrate chuck 104 and/or superstrate chuck 118 to make the formable material 124 spread without trapping voids. The spreading starts from the center of the substrate 102 and ends at the boundary of the active area of the substrate 102. At the moment shown in the FIG. 2B, the step S302 has been completed. Furthermore, at this moment, while the superstrate 108 is still in contact with the formable material 124, a multilayer structure has been formed. In particular, the multilayer structure comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 2B, in the multilayer structure, the underside surface 112 of the superstrate 108 is in direct contact with the upper surface of the formable material film 144, while the underside surface of the formable material film 144 is in direct contact with the upper surface of the substrate 102.

In step S303, after the desired field volume is filled with the formable material 124, the radiation source 126 produces energy (e.g., actinic radiation) that is directed along the exposure path 128 to the formable material 124 and that causes the formable material 124 to cure (e.g., solidify, cross-link) in conformance to a shape of the substrate's topography and a shape of the contact surface 112. The formable material 124 can be cured while the superstrate 108 is in contact with the formable material 124, thereby forming a planarized surface on the substrate 102. In an embodiment, the superstrate 102 may be temporarily unchucked from the superstrate chuck 118 and one or both of the head 120 and the substrate chuck 104 are moved away from each other prior to step S303.

In embodiments that perform IAP, the substrate 102 may have a topography (e.g., feature pattern) on its surface. For example, FIGS. 2A-2C illustrate an example embodiment of a topography on a substrate 102. The drops of formable material 124 may form a patterned layer that fills the topography 1021 on the substrate 102, and the patterned layer may have a top layer that extends above the substrate 102 and that has a top layer thickness (TLT). Furthermore, the back surface of the top layer may be featureless and planar. For example, FIG. 2C illustrates an example embodiment of a planarized surface. FIG. 2C shows a planarized patterned layer that has been formed on a substrate 102, which includes recesses and protrusions. The patterned layer fills in the recesses and protrusions in the substrate 102. The top layer of the planarized patterned layer 146, which may be referred to as the overburden, is formed above the substrate 102 and has a top layer thickness (TLT). Also, a back surface of the top layer 146 is featureless and planar.

In step S304, the superstrate 108 is separated from the cured planarized layer 146. To remove the superstrate 108 from the cured planarized layer 146 the superstrate chuck 118 may be coupled once again to the superstrate 108 (i.e., rechucking the superstrate 108) via operation of the head 120, while the superstrate 108 is still in contact with the cured planarized layer 146. In order to couple the superstrate chuck 118 with the superstrate 108, at least one of the head 120 and the stage 106 is moved using the positioning system in the Z direction until the superstrate chuck 118 comes into contact with the superstrate 108. Preferably, only one of the head 120 and stage 106 is moved in the Z direction using the positioning system, while the other is stationary. In some embodiments, the head 120 moves downwardly in the Z direction while the stage 106 remains stationary. However, in some instances both may be moved.

Once the superstrate 108 is coupled with the superstrate chuck 118, the superstrate chuck 118 may begin to lift upwardly away from the substrate 102 by using the positioning system to move the head 120 upwardly or using the positioning system to move the stage 106 downward in the Z direction. As noted above, both could also be moved. Because the superstrate 108 is coupled with superstrate chuck 118, the lifting force (or lowering force) will cause the superstrate 108 to separate from the cured planarized layer 146.

Once a cured, planarized layer 146 is formed on the substrate 102, and the superstrate 108 is separated therefrom, the cured, planarized layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices).

Figure 4:
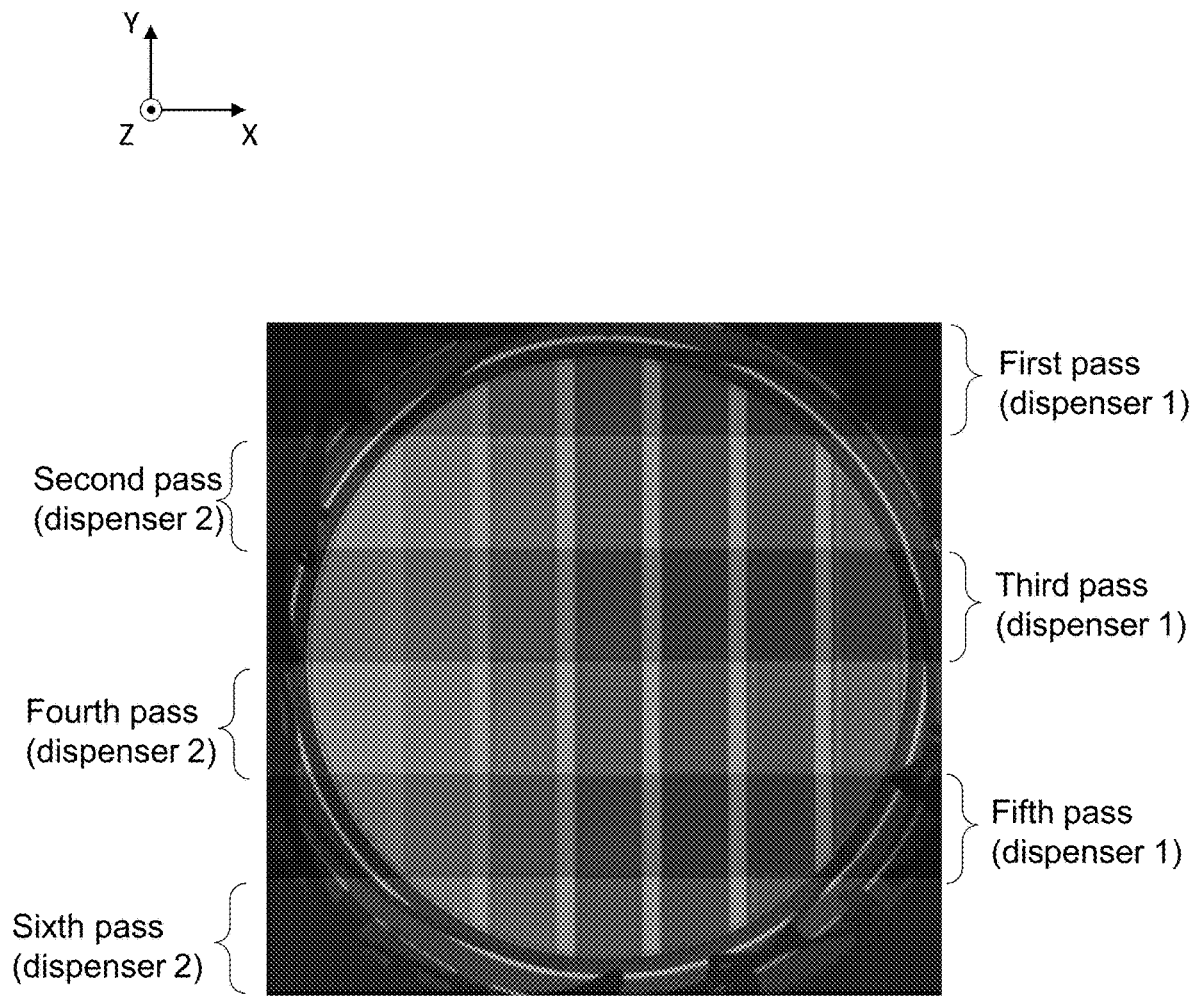
FIG. 4 illustrates an example substrate on which formable material is deposited by two fluid dispensers performing a dispensing process.
Figure 5:
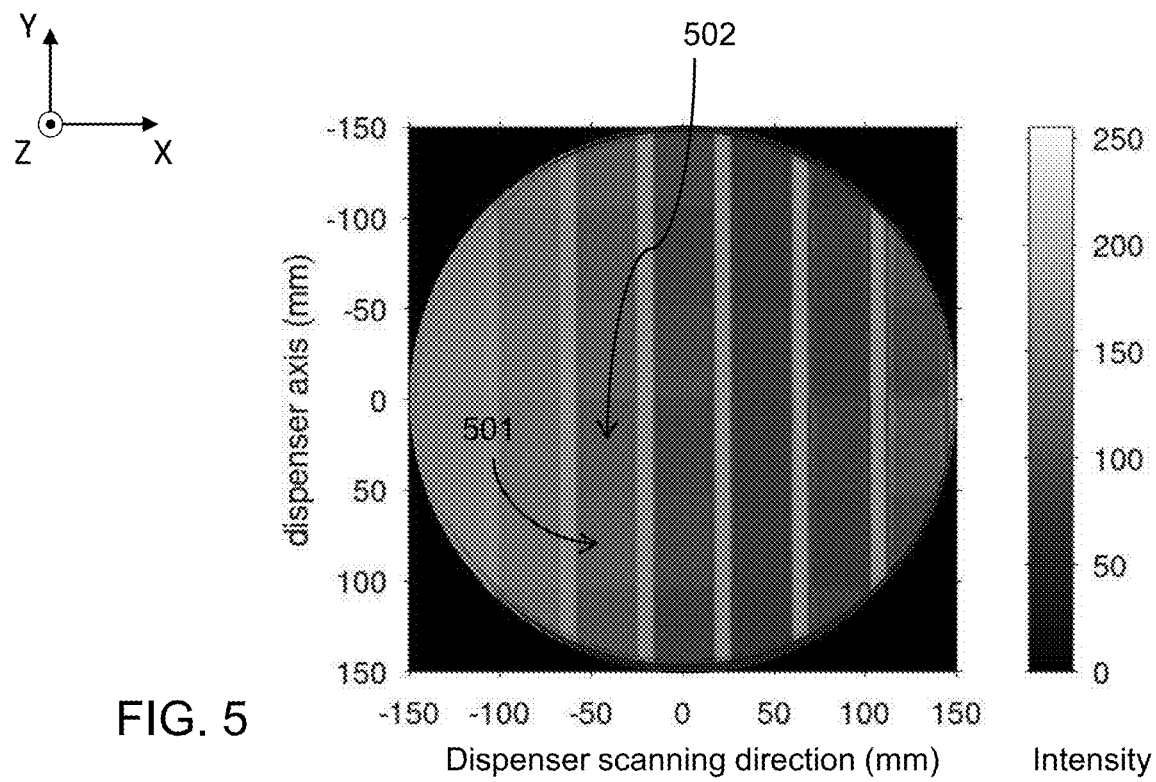
FIG. 5 illustrates an example substrate including a film formed on the substrate by curing formable material deposited on the substrate.

FIG. 4 illustrates an example substrate on which formable material is deposited by two fluid dispensers performing a dispensing process after the formable material has been contacted with a superstrate, cured, and the superstrate lifted away from the cured formable material. The positions of fluid dispenser 1 and fluid dispenser 2 with respect to the substrate during respective passes of the dispensing process are identified in FIG. 4. Dispenser 1 and dispenser 2 each execute three interleaved passes. From the top of the substrate, dispenser 1 performs the first, third, and fifth passes and dispenser 2 performs the second, fourth, and sixth passes across the substrate. In FIG. 4, to distinguish the regions of the substrate on which dispenser 1 deposits formable material during the first, third, and fifth passes from the regions of the substrate on which dispenser 2 deposits formable material during the second, fourth, and sixth passes, a shading of the regions corresponding to dispenser 1 is darker than a shading of the regions corresponding to dispenser 2. FIG. 5 illustrates the result of the dispensing process of FIG. 4.

Figure 29:
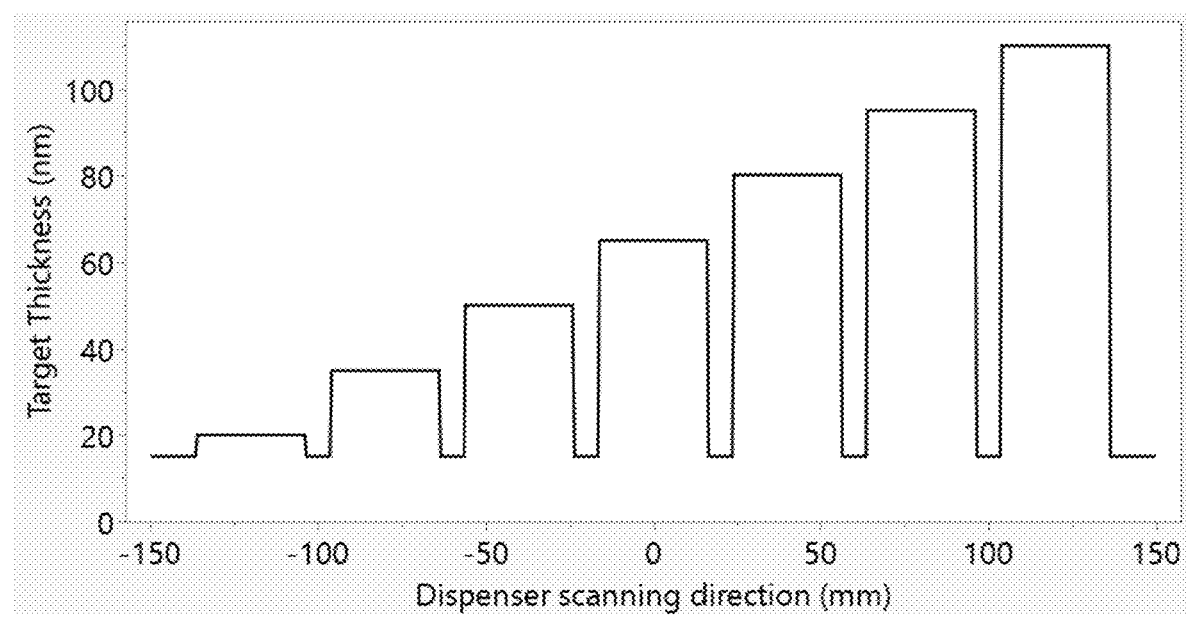
FIG. 29 illustrates an example of a target top layer thickness variation.

FIG. 5 illustrates an example substrate including a film formed on the substrate by curing formable material deposited on the substrate. The example substrate is featureless and is substantially flat on the micron scale. The dispensers are configured to dispense a drop pattern with a target top layer thickness that varies in the scanning direction of the dispensers and is constant in the direction orthogonal to the scanning direction. The target top layer thickness variation is illustrated in FIG. 29 at the substrate center in the scanning direction. For a circular substrate, the target thickness may be cropped based on the width of the substrate in the dispensing direction. The target top layer thickness is substantially similar to a step function, with a step width, trench width, trench height and a plurality of step heights. For example, the step width may be 35 mm, the trench width may be 8 mm, the trench height may be 15 nm, and the plurality of step heights may be: 20 nm, 35 nm, 50 nm, 65 nm, 80 nm, 95 nm, and 110 nm. The superstrate is flexible enough that the dispensed formable material will deform it so as to match step heights on the length scales of the step widths. The superstrate may be made of fused silica and have a thickness that is in a range of 0.03 millimeters (mm) to 2 mm. The superstrate may be made of other materials and of a thickness that provides both conformability on mm length scales and planarity on submicron length scales. The trenches have sufficient width to prevent the formable material in the different steps from mixing and keeping the heights of the different steps substantially independent of each other. The trench height is thick enough to prevent the superstrate from touching the example substrate and thin enough so as to not impact the measurement of the step heights. The step width is selected to ensure that there is sufficient area to measure the step height accurately and to avoid the impact of the curved superstrate at the boundary of the trenches and the steps. The step heights are selected based on the calibration requirements of the dispenser when it is used to dispense on a target substrate. The target substrate will have topography that has a range of heights, the plurality of step heights should cover the range of heights found in the target substrates. In an alternative embodiment, the example substrate includes a feature pattern on its surface which is the inverse of the target top layer thickness described above. The feature pattern includes a series of trenches of different depths that are separated by walls that have a constant height. A superstrate may be used to form a planar film that forms a patterned layer that fills the topography on the substrate, and the patterned layer includes a top layer that extends above the substrate and that has a top layer thickness (TLT).

In FIG. 5, the raw image captured using a spread camera is shown. In the example image of FIG. 5, there are horizontal streaks illustrating a difference in volume dispensed based on one dispenser being calibrated while another dispenser is uncalibrated. For example, the horizontal region identified by 501 dispensed by dispenser 1 has a lighter shade than the horizontal region identified by 502 dispensed by dispenser 2. As shown in FIG. 5, the drops of formable material coming out of dispenser 1 and dispenser 2 are not uniform. When multiple dispensers perform the fluid dispensing process and variations in drop volume exist between dispenses, the thickness of the film when cured may not be uniform. Thus, regular calibration of fluid dispensers may prevent discrepancies in dispensed patterns so that the planarized film is more likely to be uniform.

Figure 6:
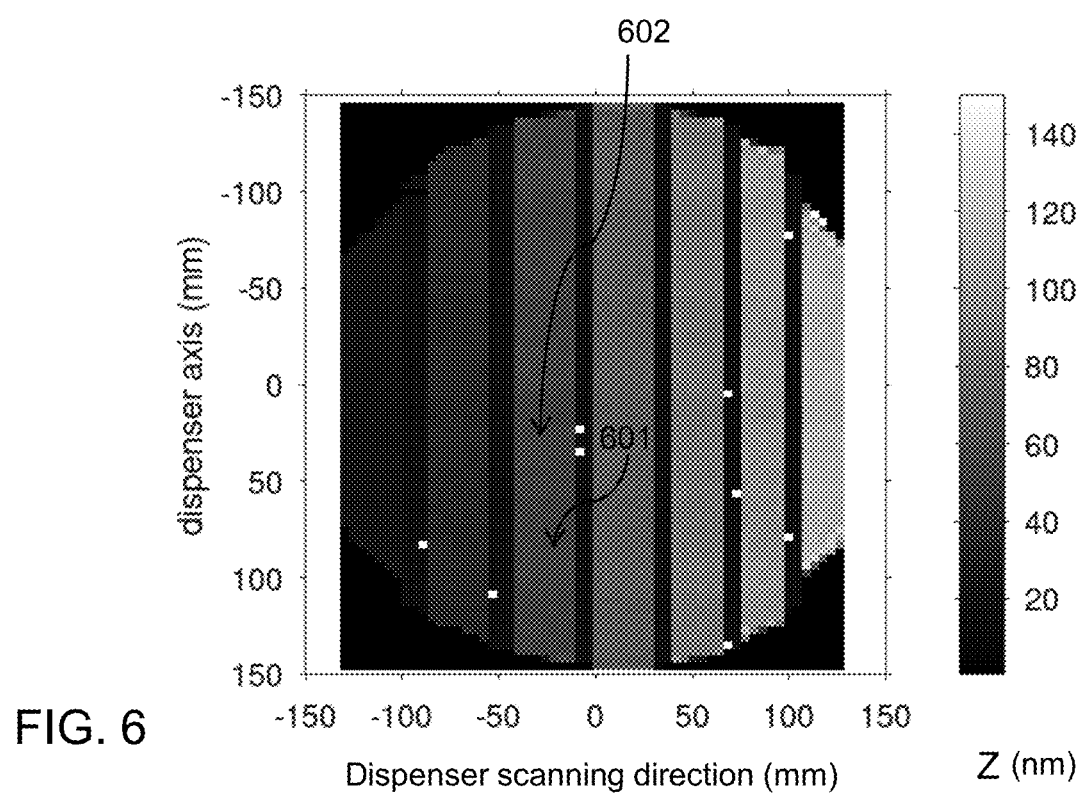
FIG. 6 illustrates an example heat map of ellipsometer data corresponding to a substrate including a film.
Figure 7:
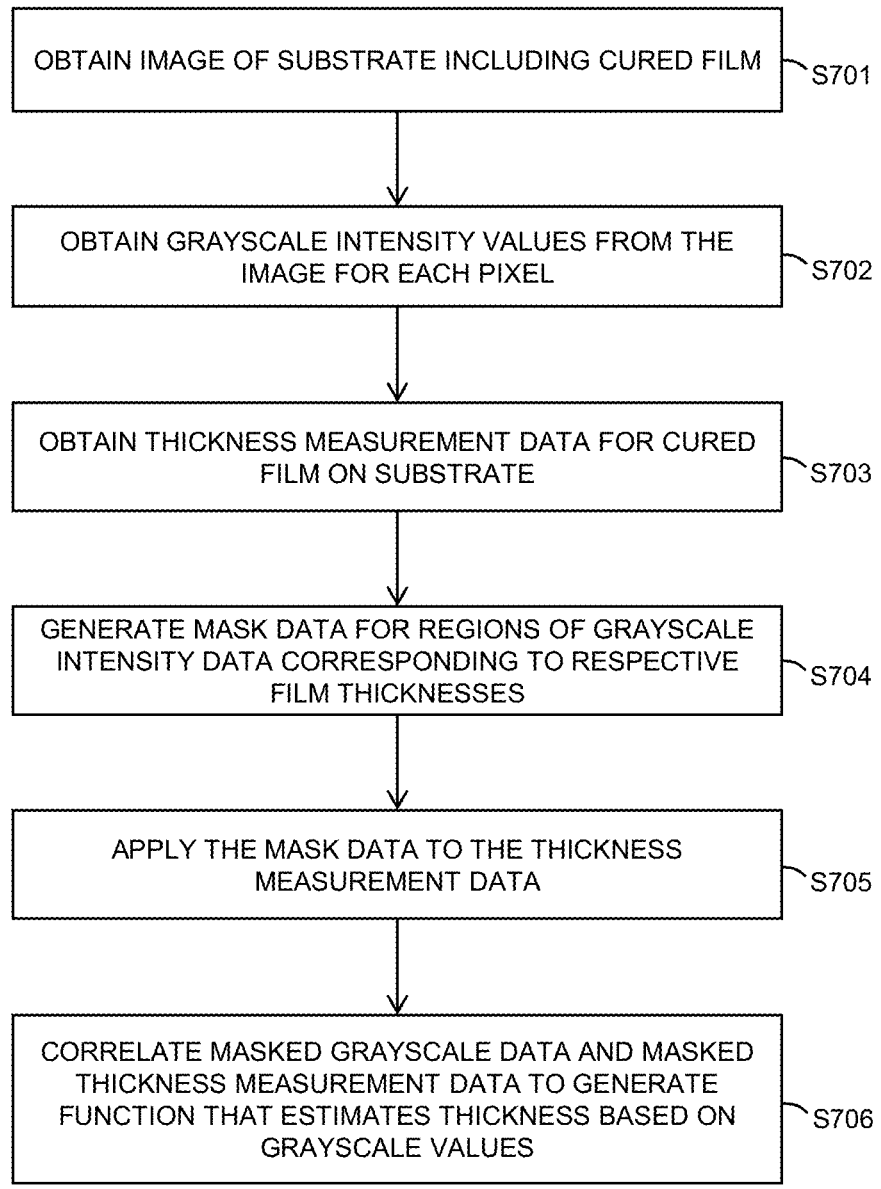
FIG. 7 illustrates an operational flow of an example method for estimating film thickness.
Figure 30:
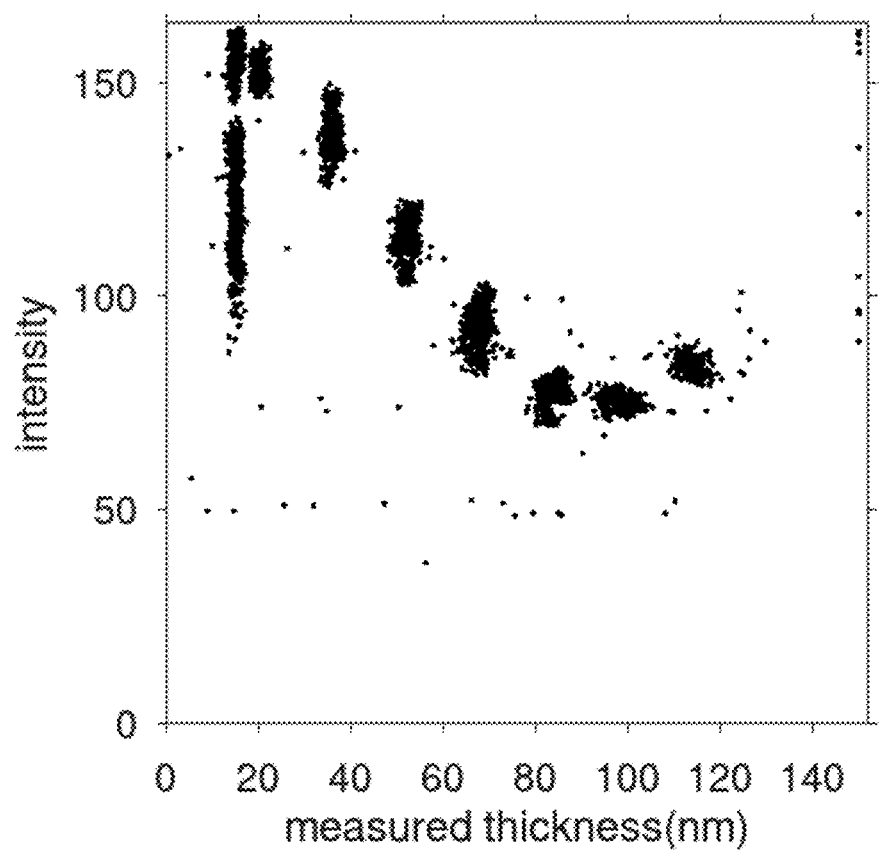
FIG. 30 illustrates an example correlation between raw image data and ellipsometry data.

FIG. 6 illustrates an example heat map of ellipsometer data corresponding to the substrate of FIG. 5. In the heat map of FIG. 6, the issue of variations of volume output by respective dispensers is depicted and also the impact of the superstrate being deformed by the variations in the thickness of the formable material under the superstrate. The horizontal regions identified by 601 and 602 correspond to horizontal regions 501 and 502, respectively. FIG. 6 illustrates ellipsometer data which may be used to detect the different thicknesses of a cured film. However, collecting ellipsometer data may be time consuming and difficult because it requires removing and transporting the processed wafer to a dedicated measuring tool. According to a method according to FIG. 7, after a film is measured on an ellipsometer, the data may then be used to estimate film thickness using grayscale intensity data. FIG. 30 is an illustration of the raw correlation between the raw image data and the ellipsometry data. Note the noise in the correlation between spread camera intensity data and ellipsometry data. FIG. 7 is a method of estimating film thickness that reduces that noise so that intensity data can be used to supply nanometer level estimations of the film thickness when calibrating dispensers used in nanometer scale shaping tools such as IAP and NIL.

Figure 8:
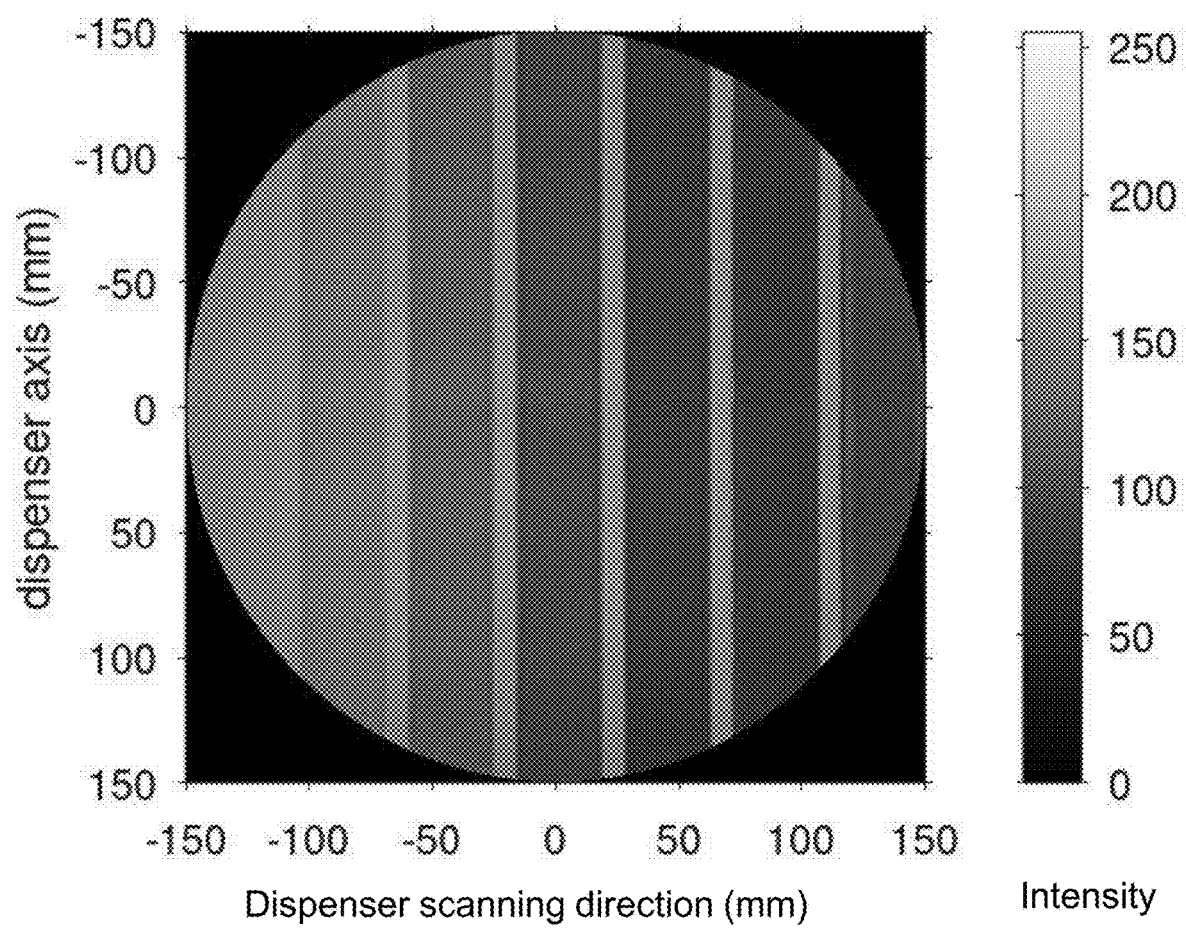
FIG. 8 illustrates an example image of a substrate.

FIG. 7 illustrates an operational flow of an example method for estimating film thickness. In step S701, an image is obtained of substrate including a cured film. The one or more processors 132 of the nanoimprint lithography system 100 may control the camera 136 to capture an image of a substrate. The camera 136 may capture a grayscale image. In some embodiments, the camera 136 or the one or more processors 132 perform image processing on the image of the substrate to obtain a grayscale image. Step S701 occurs after the process described in FIG. 3. Thus, the substrate in step S701 includes a cured layer, such as shown in FIG. 2C. For example, FIG. 8 illustrates an example raw image of a substrate including a cured film which is captured by the camera 136. The feature pattern of the substrate or the feature pattern of the target thickness in FIG. 8 is the feature pattern described above with reference to FIG. 5.

Figure 9A:
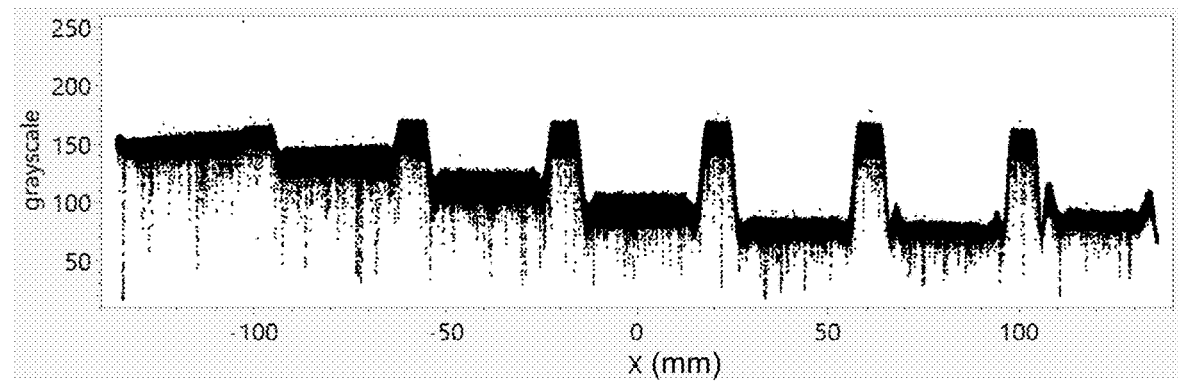
FIG. 9A illustrates an example plot of grayscale intensity data for all pixels of an image of a substrate.

In step S702, the one or more processors 132 obtain grayscale intensity values from the image for each pixel of the image shown in FIG. 8 associated with positions on the substrate. For example, the one or more processors 132 extract grayscale values and corresponding X and Y values. FIG. 9A is a plot of the grayscale intensity data for all of the pixels in the image versus the x-coordinate axis of the substrate.

Figure 11:
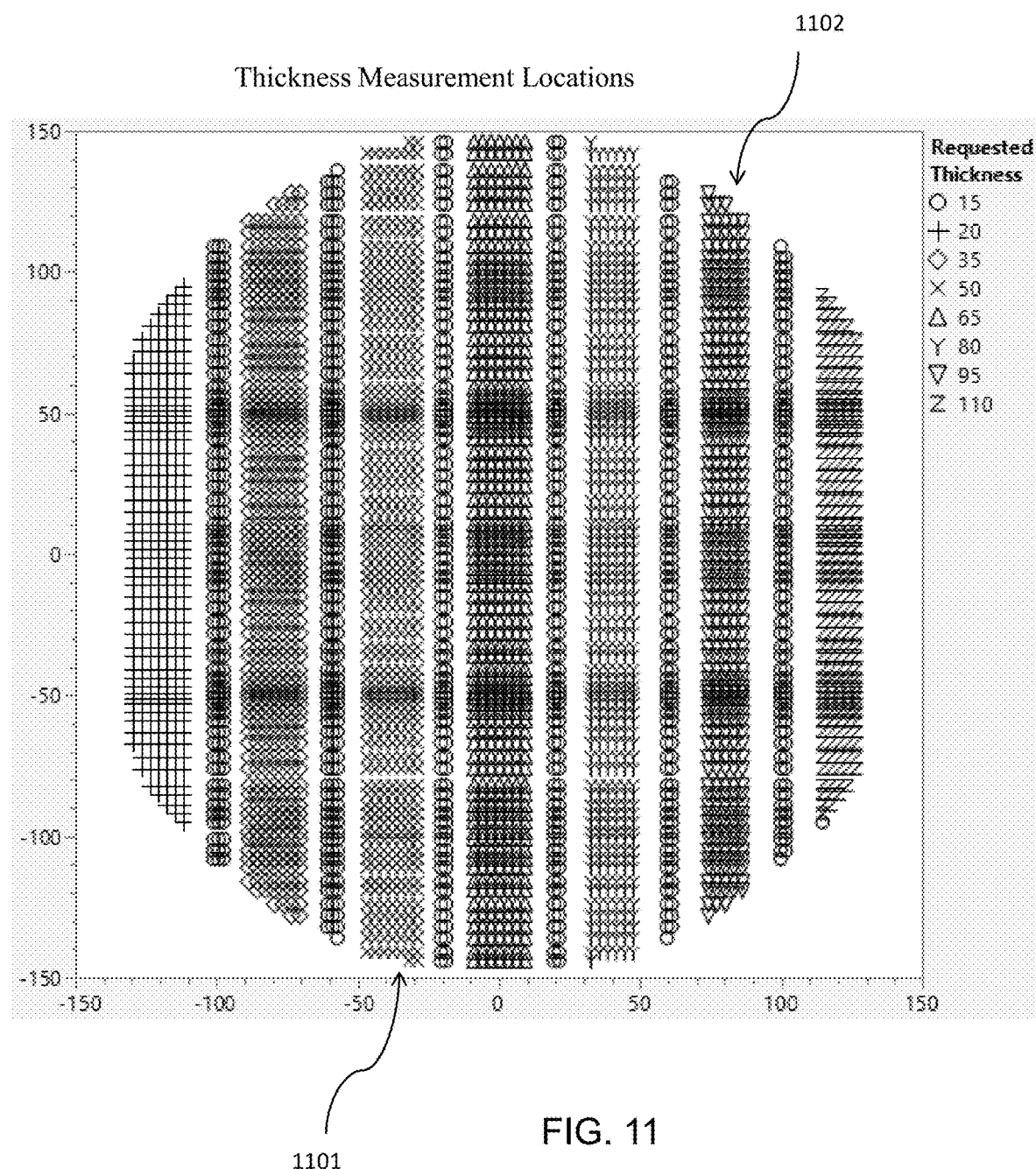
FIG. 11 illustrates example thickness measurement data corresponding to a substrate including a film.

In step S703, thickness measurement data is obtained for the cured film on the substrate. For example, FIG. 11 illustrates thickness measurement locations of the cured film on the substrate shown in FIG. 8 as measured by an ellipsometer. The data points are coded with the requested thickness that was used during drop pattern generation of drop pattern used to during planarization. This target thickness for each column is shown on the right side of FIG. 11.

Figure 9B:
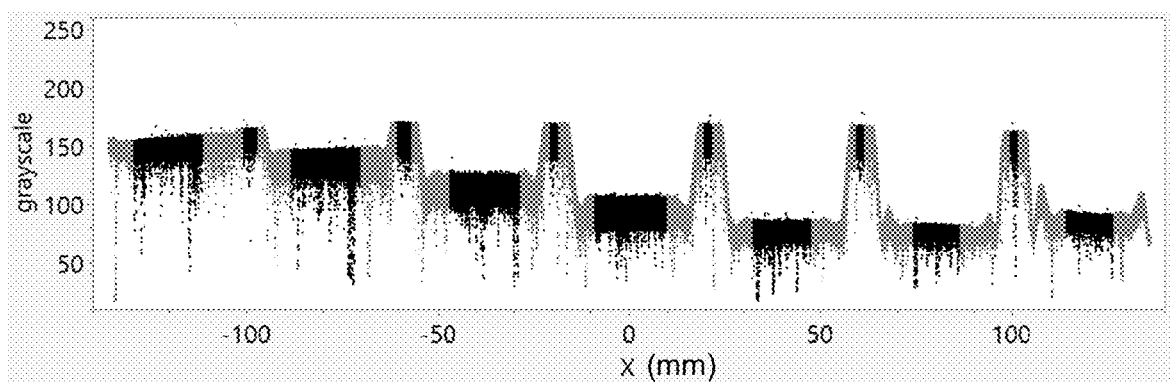
FIG. 9B illustrates an example plot showing the locations of a mask on the grayscale intensity data of FIG. 9A.
Figure 9C:
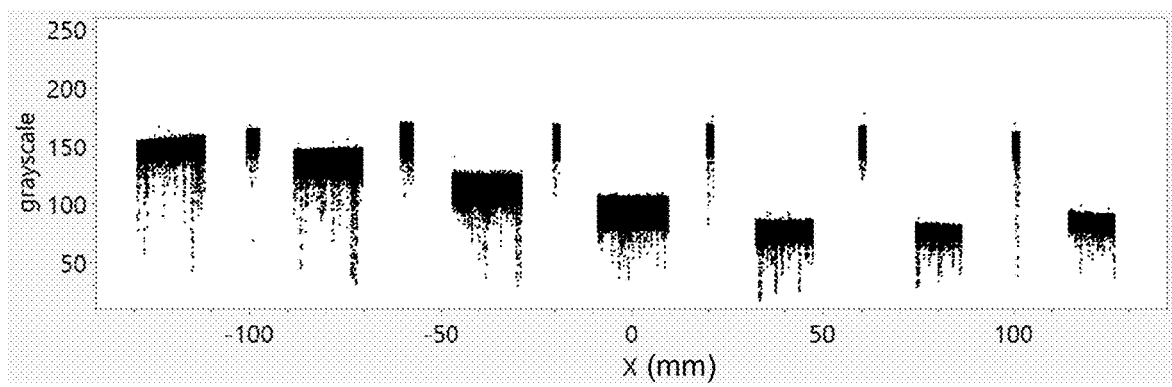
FIG. 9C illustrates an example plot showing masked grayscale intensity data.
Figure 10:
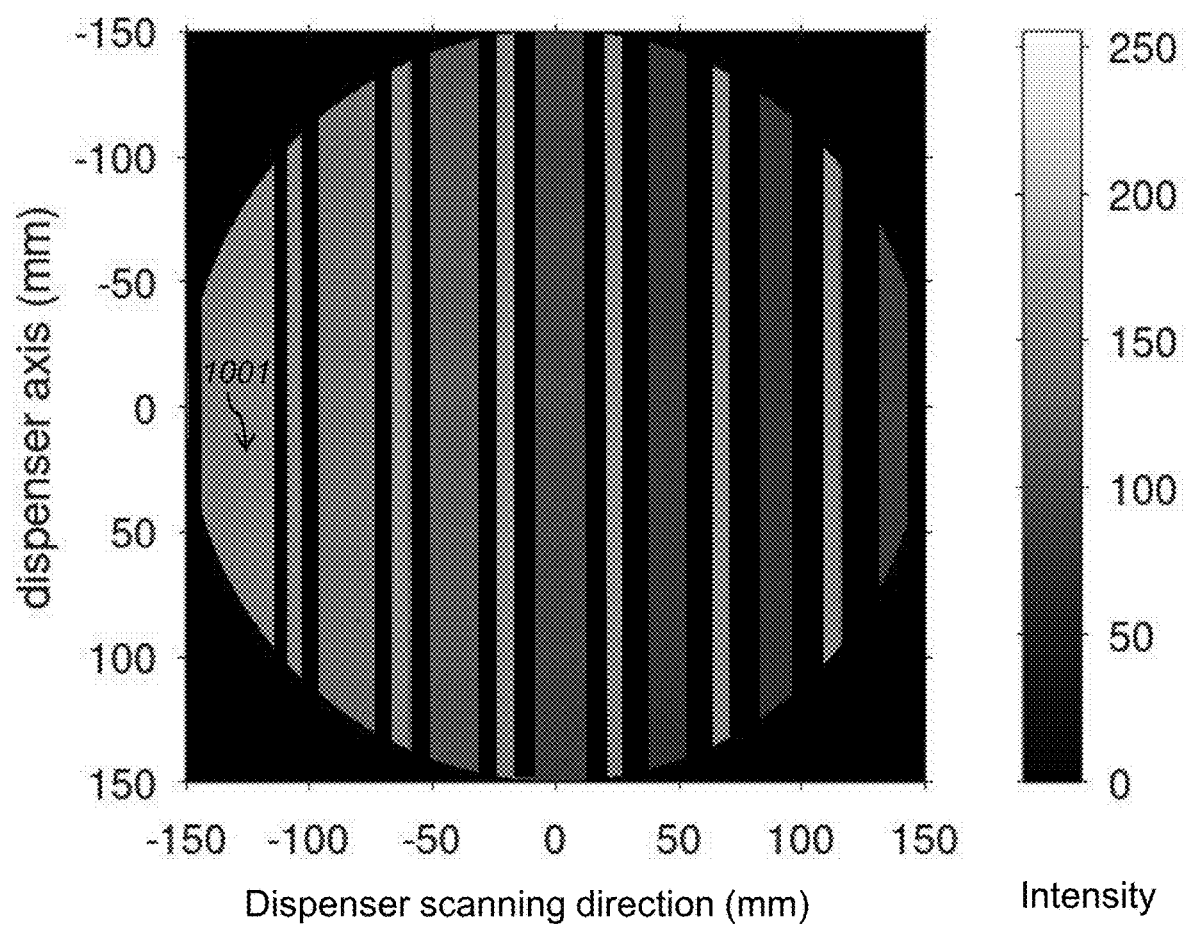
FIG. 10 illustrates an example mask applied to grayscale image data corresponding to a substrate including a film.
Figure 31:
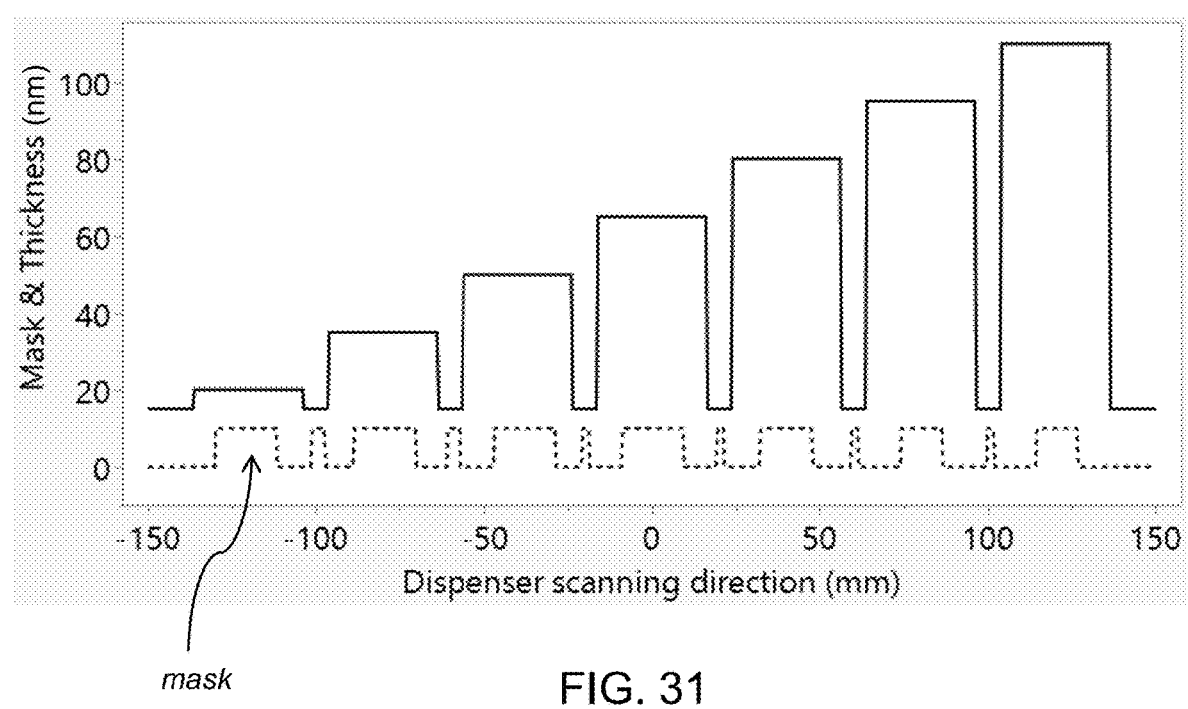
FIG. 31 illustrates example mask data relative to target thickness for a film.

In step S704, the one or more processors 132 generate mask data for regions of the grayscale intensity data corresponding to respective film thicknesses. The mask generated in step S704 is to account for variations in grayscale data where the superstrate 108 is curved. During the curing process, the superstrate 108 is in contact with the surface of the formable material. Because the wafer has a series of steps of different heights that are separated by trenches that have a constant height above the substrate, the trenches are wide enough that the superstrate 108 bulges at the steps. This bulging occurs because the superstrate is flexible on the scale of the steps. In order for this bulging to not have a bad influence on the calibration, only the data that is not impacted by the bulging superstate 108 is used during calibration. Thus, to avoid misleading data near the edges of walls of trenches, a mask is generated to reduce the data set to those intensity values at the center of the regions, as shown in FIG. 10. Thus, in step S704, mask data is generated for regions of grayscale intensity data corresponding to respective film thicknesses. For example, FIG. 10 may be generated by applying a mask corresponding to FIGS. 9B and 9C to a grayscale plot. As shown in FIG. 10, the masked region becomes narrower for each column across the substrate in the X-direction from left to right. FIG. 31 is an illustration of the mask data and the target thickness. The mask data has a series of steps that have openings that are centered on the step widths that are narrower than the step widths based on the step height (mask width=step width–f (step height). The function f represents the curvature of the superstrate due to the superstrate being curved around the steps. The function f may vary between 0.1 to 10 mm over a 200 nm step height range and depends on the flexibility of the superstrate. For example, a region 1001 of FIG. 10 includes a masked region that is larger, in the X-direction, than each of the other regions between the trenches in FIG. 10 because the data for the region 1001 is more accurate than the data for the other regions of FIG. 10. FIG. 9B is a plot showing the locations of the mask on the grayscale intensity versus the x-coordinate axis of the substrate. This is because the difference in the step height and the trench of the target volume for the region 1001 is smaller than the respective differences in the step height and the trench of the target volume for each other region. On the other hand, the column farthest to the right of the substrate in the X-direction includes the narrowest masked region because the height of the step relative to the trench causes the superstrate to have the highest curvature among the regions in FIG. 10.

In step S705, the one or more processors 132 apply the mask shown in FIG. 10 to the thickness measurement data. For example, as shown in in FIG. 11, column 1101 at a depth of about 50 nm is a larger width than column 1102 at a depth of about 95 nm. This is because the data near the edges of the column 1102 is unreliable due to the curvature of the superstate on the substrate. FIG. 9C is a plot showing the masked grayscale intensity versus the x-coordinate axis of the substrate.

Figure 12:
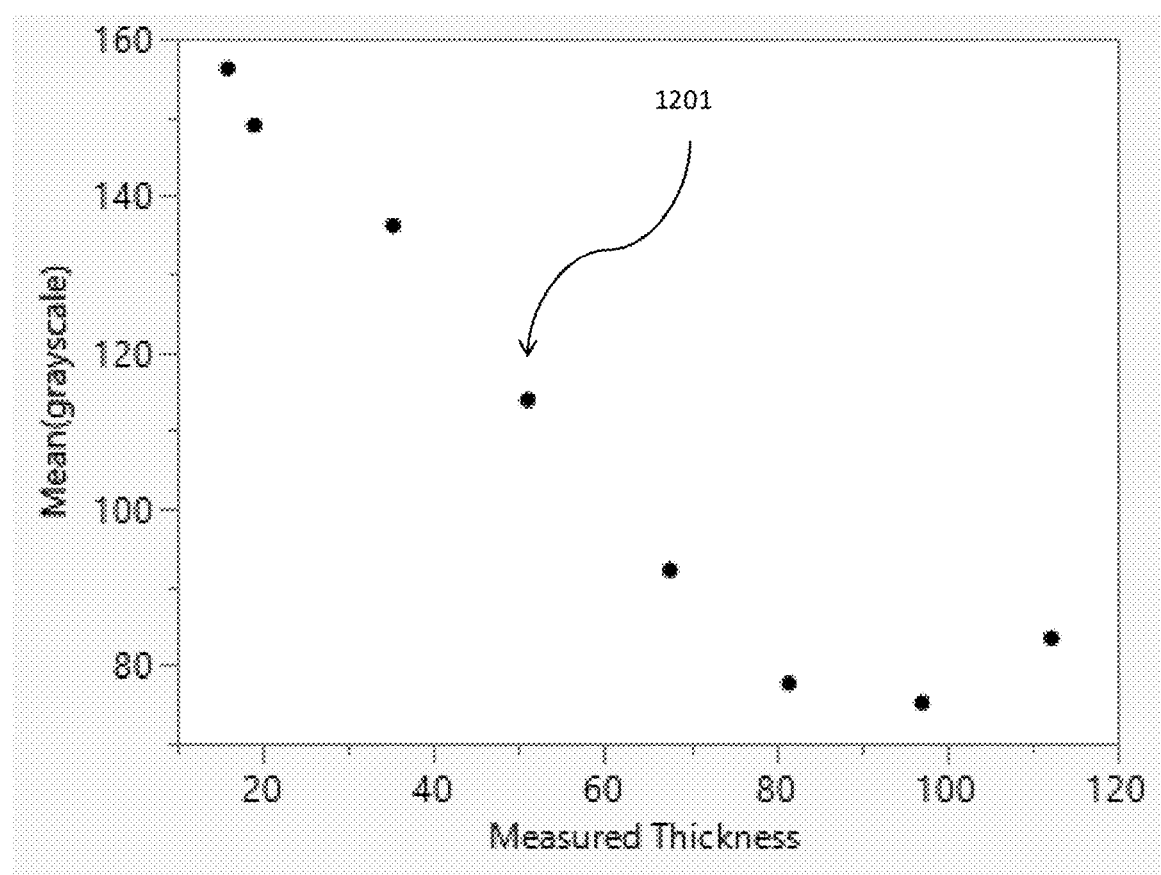
FIG. 12 illustrates an example set of relationship values indicating relationships between grayscale intensity values and corresponding film thickness values.

In step S706, the masked grayscale data and the masked thickness measurement data are correlated to generate a function that estimates thickness based on grayscale values. In some embodiments, the masked grayscale data and the masked thickness measurement data are then processed using a series of statistical processes to obtain better data. The statistical processes may include, for example, removing outliers, averaging in the dispense direction in each masked step region, averaging along the dispenser direction over a limited area that is less than a length of the dispenser, or other suitable statistical process(es). The ellipsometry data may be correlated with the subset of the camera data to create the function that estimates the thickness based on just the grayscale values. For example, FIG. 12, illustrates the points of the average value of the grayscale masked region of FIG. 10 and the corresponding measured value of the thickness. Point 1201, for example, is a point corresponding to column 1101 of FIG. 11, where point 1202 is a representation of the mean value of the all the data within the masked region of the column corresponding to column 1101 in the masked data of FIG. 10.

These grayscale values shown in FIG. 12 may then be used to adjust the drop pattern density that correlates location, dispenser, dispenser pass, and drop density. Moreover, the drop densities or drop volumes are then adjusted until the grayscale values are constant along the column direction. According to the method of FIG. 7, a set of relationship values is obtained, as shown in FIG. 12. The set of relationship values represented by the function shown in FIG. 12 indicates relationships between grayscale intensity values and corresponding film thickness values, the grayscale intensity values based on an average of grayscale values extracted from the image of the film on the substrate of FIG. 8, the film thickness values based on the thickness measurements for the film on the substrate collected in FIG. 11.

In FIG. 12, the points (for example, point 1201) representing the respective average grayscale value corresponding to each film thickness have a relationship which is a function of the complex refractive index of the cured film and the substrate, the film thickness, and the effective detection wavelength (detection wavelength in vacuum/ refractive index of the cured film). Due to interference effects, this correlation relationship is monotonic over a limited range determined by the effective detection wavelength. If a measurement needs to be made beyond this limited range, then more than one effective detection wavelength can be used. A model that describes the intensity as a function of thickness may also be used. If a model is used, then the model may have to include the effect of any underlying layers on the substrate. For the last two points shown at a measured thickness of about 97 nm and 115 nm on FIG. 12, the linear relationship is no longer shown in this example. The grayscale values obtained for these high film thicknesses are not distinguishable due to the intensity of light source used for illuminating the substrate when the image of FIG. 8 was captured. In some embodiments, the image of the substrate is captured using light sources of different intensities and/or wavelengths. Accordingly, the grayscale values obtained at each step width would be more distinguishable than in the example plot of grayscale pixel values of FIG. 9. Additionally, therefore, a more linear function throughout for each film thickness obtained, relative to the linear function illustrated in FIG. 12, for which the linear relationship is present for film thicknesses up to about 90 nm.

Figure 13:
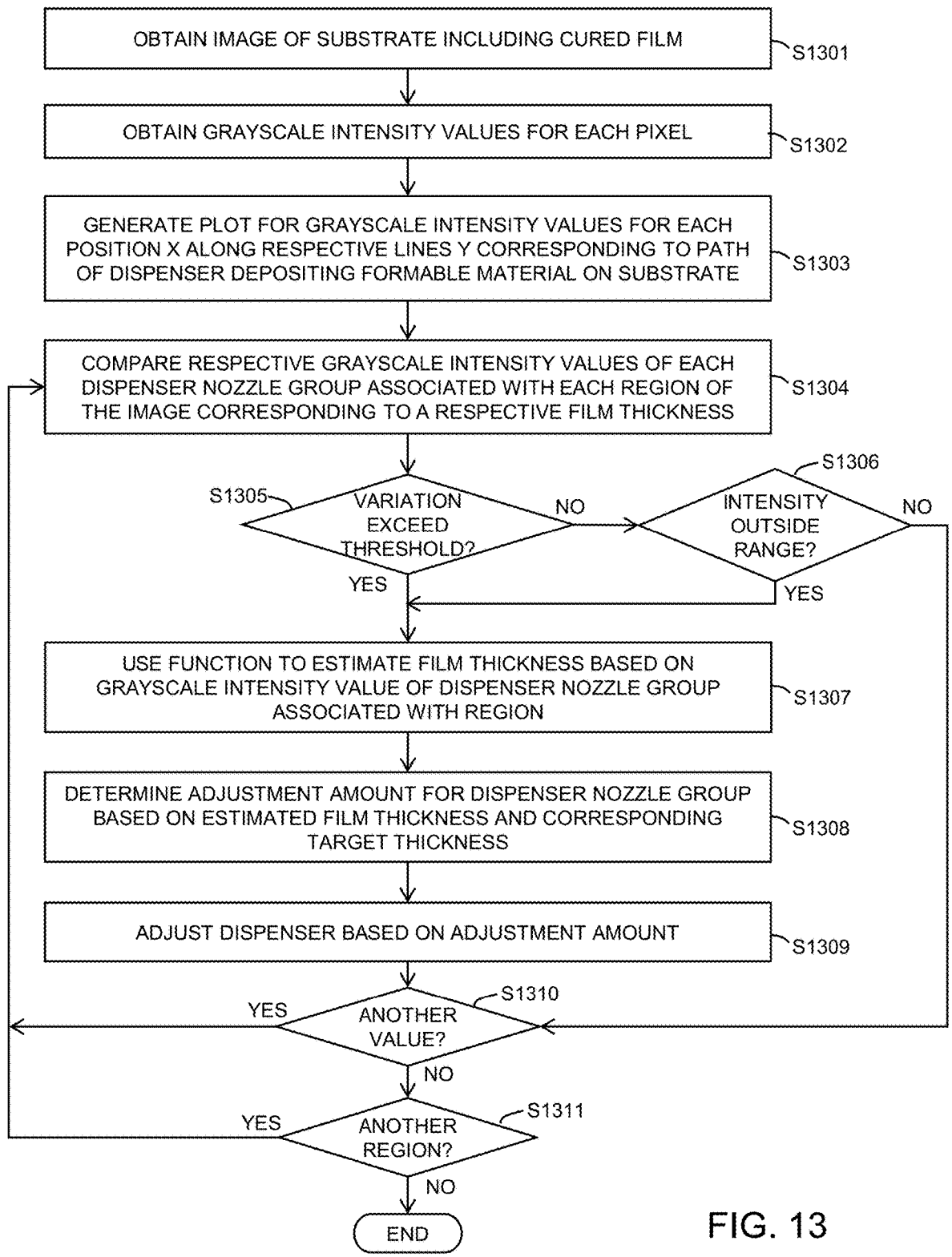
FIG. 13 illustrates an operational flow of an example method for adjusting a fluid dispenser.
Figure 14:
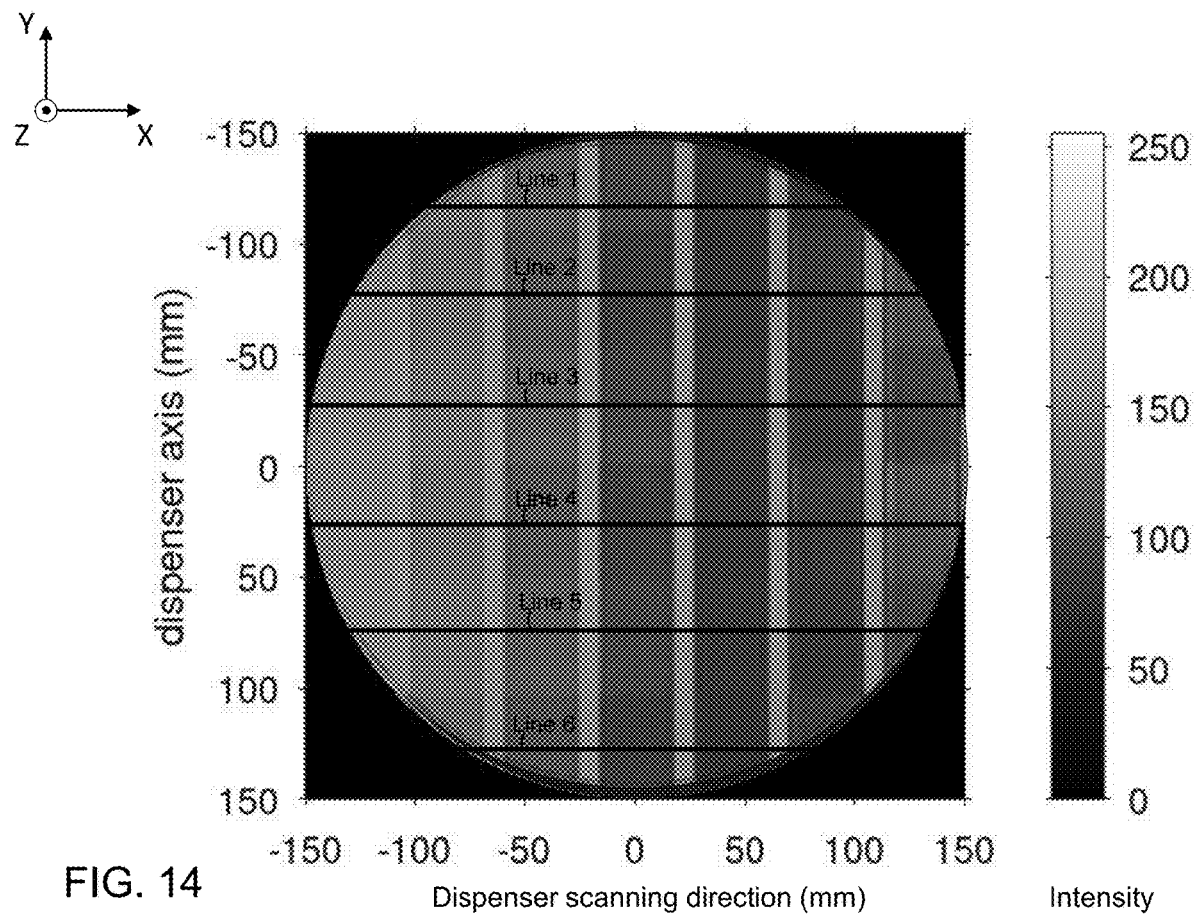
FIG. 14 illustrates an example grayscale image of a substrate including a film.
Figure 15:
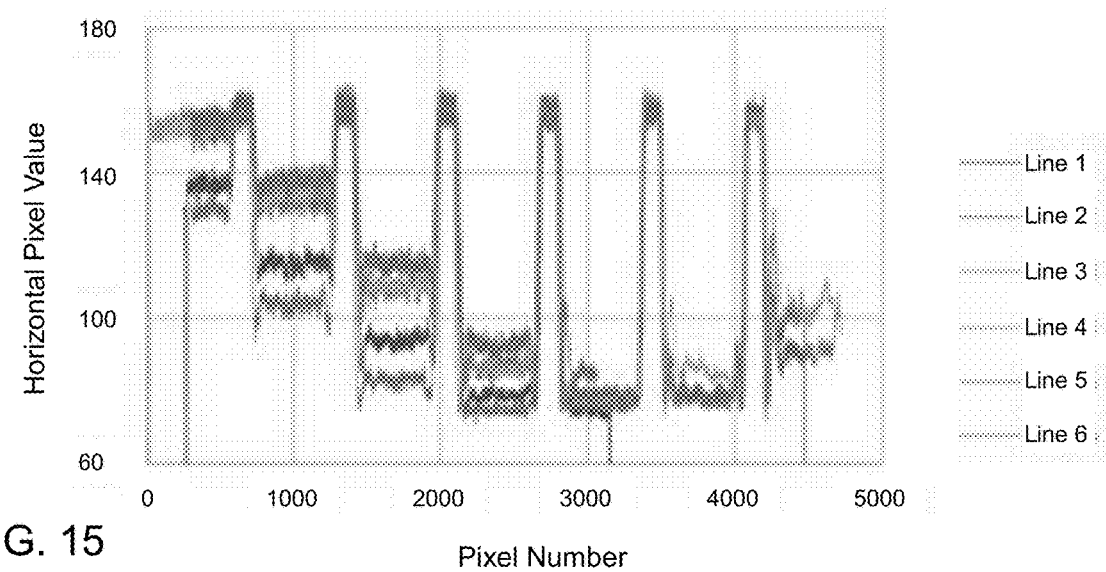
FIG. 15 illustrates an example plot of grayscale pixel values corresponding to respective positions on the image of the substrate of FIG. 14.

FIG. 13 illustrates an operational flow of an example method for adjusting a fluid dispenser. In step S1301, the one or more processors 132 obtain an image of a substrate including a cured film having a calibration style targeted thickness pattern. For example, the camera 136 obtains the image shown in FIG. 14. In step S1302, the one or more processors 132 obtain grayscale intensity values for each pixel of the image obtained in step S1301. In step S1303, the one or more processors 132 generate a plot for grayscale intensity values for each position X along respective lines Y corresponding to the path of a dispenser depositing formable material on substrate. For example, in FIG. 14, Lines 1, 2, 3, 4, 5, 6 correspond to respective lines Y at which grayscale intensity values have been obtained. The Lines 1, 3, 5 correspond to regions of the substrate on which one dispenser 122a deposited formable material. The Lines 2, 4, 6 correspond to regions of the substrate on which a second dispenser 122b deposited formable material. In some embodiments, each of Line 1, Line 3, and Line 5 corresponds to a respective group of nozzles of the dispenser 122a, and each of Line 2, Line 4, and Line 6 corresponds to a respective group of nozzles of the dispenser 122b. The one or more processors 132 then generate a plot for grayscale intensity values at each X position along Line 1, Line 2, Line 3, Line 4, Line 5, and Line 6. For example, FIG. 15 illustrates the plot of grayscale pixel values corresponding to the respective X positions along Line 1, Line 2, Line 3, Line 4, Line 5, and Line 6 on the image of the substrate of FIG. 14.

In step S1304, the one or more processors 132 compare respective grayscale intensity values of each dispenser nozzle group associated with each region of the image corresponding to a respective film thickness. For example, in the plot of FIG. 15, grayscale pixel values corresponding to respective step heights are compared. As shown by the plot of FIG. 15, there the pixel intensity values of lines 1, 3, 5 varies from the pixel values 2, 4, 6 by about 40 at horizontal positions corresponding to respective step heights. As discussed with reference to FIG. 12, the difference in intensity values is diminished at the thicker films due to the grayscale values at thicker films being indistinguishable from each other due to destructive interference and/or high absorption.

In step S1305, the one or more processors 132 compares variations between pixel values with a threshold to determine whether the variation between pixel intensity values of the respective lines (1, 2, 3, 4, 5, 6) vary by more than the threshold value. The image processing techniques discussed above to generate the calibration curve may also be used on these pixel values. The threshold value is a predetermined value determined based on the tolerable difference in volume output of respective dispenses used for outputting the formable material and the calibration curve generated in the method described in FIG. 7. If the one or more processors 132 determine the variations between respective pixel intensity values exceeds the threshold, the flow advances to step S1307. On the other hand, if the one or more processors 132 determine the variations between respective pixel intensity values do not exceed the threshold, the flow advances to step S1306.

In step 1306, the one or more processors 132 determines whether the intensity value measured in step S1302 and plotted in step S1303 is outside a range of acceptable intensity values. For example, in FIG. 15, the highest intensity value of about 140 for the column centered pixel number 1000 may be above a predetermined threshold based on the target thickness of the film at that column of the substrate. Thus, for example, if pixel intensity values for a region are too high due to a group of nozzles of a dispenser not outputting enough formable material corresponding to the region of the film, then then the one or more processors 132 may determine the intensity values are outside a range of acceptable intensity values. If the one or more processors 132 determine the intensity values are outside the range of acceptable intensity values, the flow advances to step S1307. On the other hand, if the one or more processors 132 determine the intensity values are not outside the range of acceptable intensity values, the flow advances to step S1310.

In step S1307, the one or more processors 132 use the function generated in step S706 to estimate film thickness based on grayscale intensity values of the dispenser nozzle group associated with the region of the substrate. For example, in FIG. 15, the grayscale intensity values for the third column of the substrate centered at about pixel number 1700, have a range of about 80 to 120 pixel intensity value. As shown in FIG. 11, the target thickness for this film is 50 nm (see column 1101 of FIG. 11). However, the pixel intensity value of the lightest line for that X position is about 120. Using the function illustrated in FIG. 12, a grayscale intensity value of about 120 corresponds to an estimated film thickness of about 45 nm.

In step S1308, the one or more processors 132 determine the adjustment amount for the dispenser nozzle group based on the estimated film thickness and corresponding target thickness. In example, discussed above with reference to step S1307, the estimated film thickness for the lightest line of the third step column is about 45 nm. Thus, the estimated step height (45 nm) for this region of the substrate shown in FIG. 14 is about 10% below the target thickness (50 nm) for this step, as indicated by the target thicknesses on the FIG. 11. Accordingly, the adjustment amount for the dispenser nozzle group corresponding to this step is to adjust the volume dispensed by the dispenser nozzle group during this pass by an increase of 10% output.

In step S1309, the one or more processors 132 adjust the dispenser corresponding to the adjustment amount determined in step S1308 based on the determined adjustment amount. For example, for the dispenser nozzle group corresponding to the estimated step height of 45 nm in the column 1101, the one or more processors 132 would adjust a drop volume and/or drop density for the dispenser nozzle group so that the total volume of formable material dispensed to the region is increased by 10%. Examples of methods for adjusting drop volume and drop density are described with reference to FIGS. 17, 20, and 21.

In step S1310, the one or more processors 132 determine whether another pixel intensity value needs to be evaluated, among the pixel intensity values plotted in step S1303. If another pixel intensity value is present that has not yet been evaluated (Yes in step S1310), the flow proceeds to step S1304. Step S1304 is, thus, performed for each pixel intensity value plotted in step S1303. On the other hand, if the one or more processors 132 determine that no other pixel intensity value needs to be evaluated (No in step S1310), the flow proceeds to step S1311.

In step S1311, the one or more processors 132 determine whether pixel intensity values of another region of the image need to be evaluated, among the pixel intensity values plotted in step S1303. If pixel intensity values of another region of the image have not yet been evaluated (Yes in step S1311), the flow proceeds to step S1304. Step S1304 is, thus, performed for each pixel intensity value plotted in step S1303 for each region (for example, the seven separate column regions of different film thickness) of the image. On the other hand, if the one or more processors 132 determine that no other pixel intensity values need to be evaluated in another region of the image (No in step S1311), the flow ends.

Figure 16:
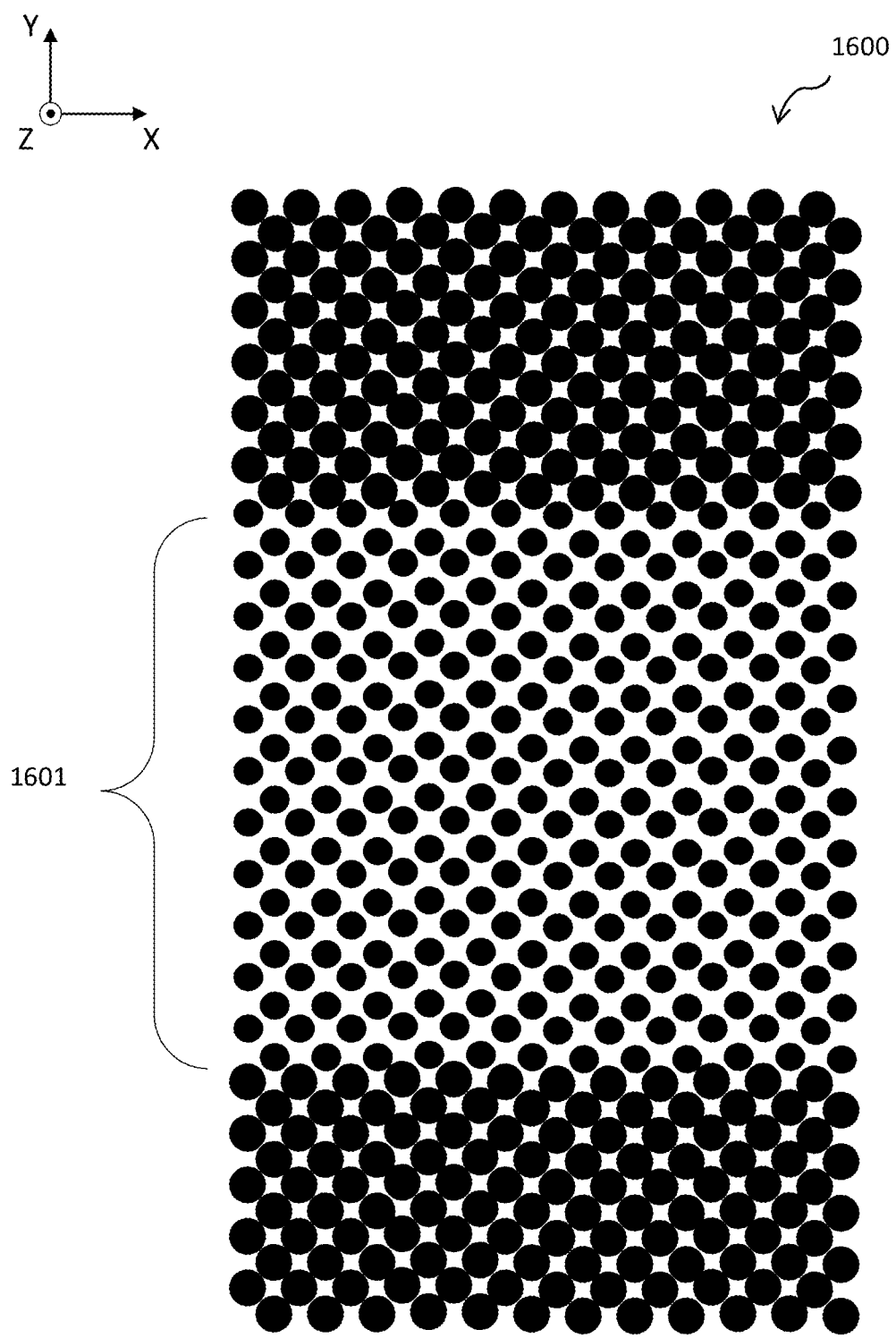
FIG. 16 illustrates an example set of drops of formable material.
Figure 20:
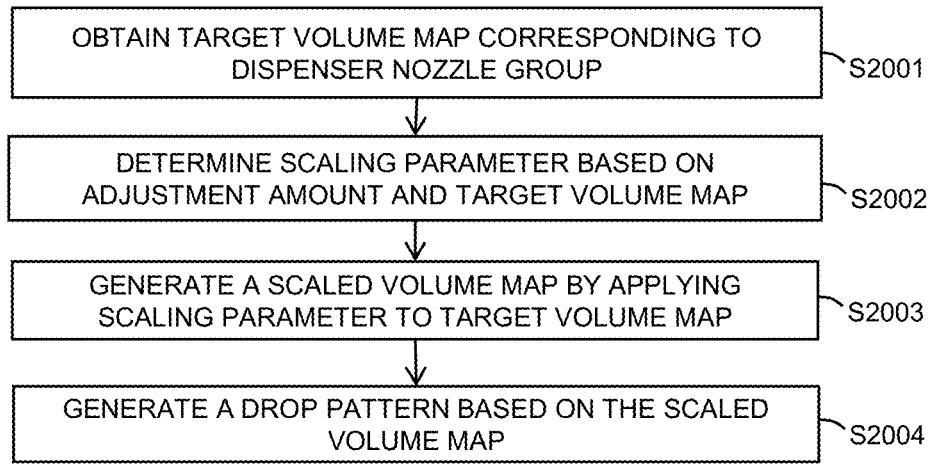
FIG. 20 illustrates an operational flow of an example method for changing a drop pattern to modify drop volume.
Figure 21:
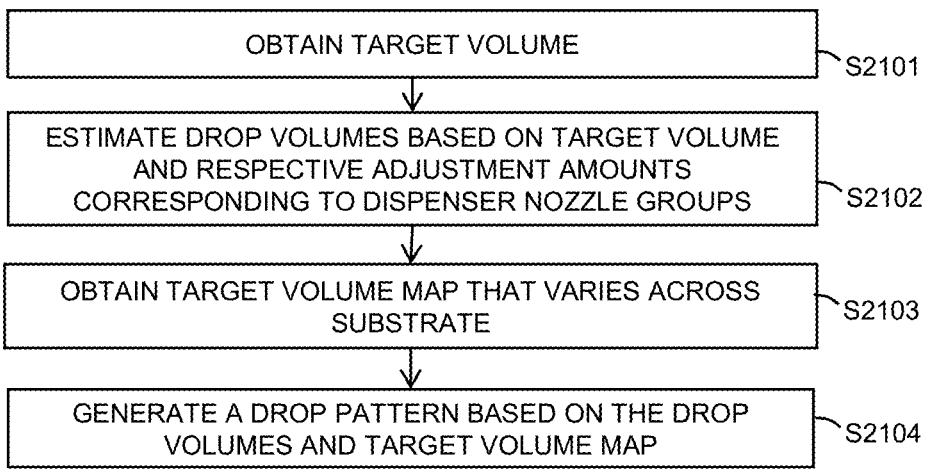
FIG. 21 illustrates an operational flow of an example method for adjusting drop volume.

FIG. 16 illustrates an example set of drops of formable material. In the example set of drops 1600 of FIG. 16, the drops in region 1601 have a lower volume than the other drops included in the set of drops 1600. Additionally, the drops in region 1601 have a lower drop density than the other drops included in the set of drops 1600, the drops in region 1601 being spaced farther apart from each other than the other drops included in the set of drops 1600. In the example set of drops 1600 of FIG. 16, one dispenser 122a deposited the drops within the region 1601 while a different dispenser 122b deposited the drops included in the set of drops 1600 outside the region 1601. Accordingly, the adjustment of step S1309, and described with reference to FIGS. 17, 20, and 21, is made with respect to the dispenser 122a so that the group of pixels of the dispenser 122a which deposited the drops within the region 1601 will increase the total volume of formable material dispensed based on the adjustment.

Figure 17:
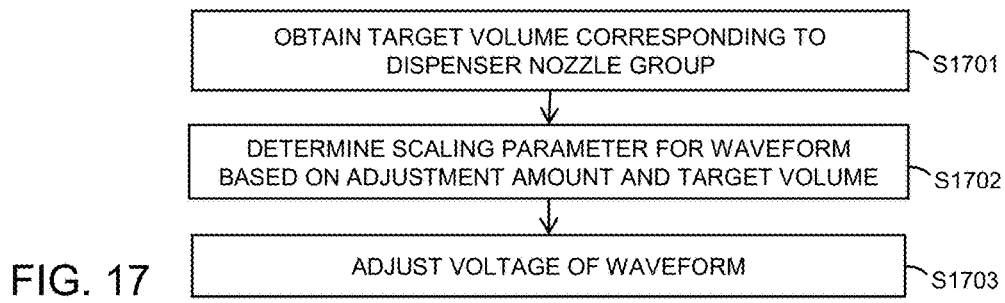
FIG. 17 illustrates an operational flow of an example method for adjusting a waveform to modify drop volume.

FIG. 17 illustrates an operational flow of an example method for adjusting a waveform to modify drop volume. In step S1701, the one or more processors 132 obtain a target volume corresponding to the dispenser nozzle group which is to be adjusted. For example, the target volume for a pass of the dispenser 122a may correspond to the requested thicknesses shown in FIG. 11. In step S1702, the one or more processors 132 determine a scaling parameter for a waveform based on the adjustment amount determined in step S1308 and the target volume obtained in step S1701. For example, in the example discussed above with reference to step S1308, the adjustment amount for the dispenser nozzle group is to increase the volume of formable material dispensed by the dispenser nozzle group by 10%. The one or more processors 132 then access a lookup table stored in the one or more computer-readable storage media 134 which identifies voltages corresponding to drop volumes. The one or more processors 132 then determine, based on the lookup table, a voltage that corresponds to a drop volume that is a 10% increase relative to the target volume obtained in step S1701. For example, instead of a standard voltage of 20 volts, a new voltage based on the lookup table may be higher, for example, 20.5 volts, in order to achieve the 10% increase in drop volume.

In step S1703, the one or more processors 132 adjust a voltage of a waveform based on the new voltage determined in step S1702. For example, the one or more processors 132 may increase the voltage of waveform from 20 volts to 20.5 volts, for example, to increase the drop volume output by the dispenser 122a. In the example illustrated in FIG. 18, the voltage of a waveform is adjusted to produce a larger drop volume.

Figure 18:
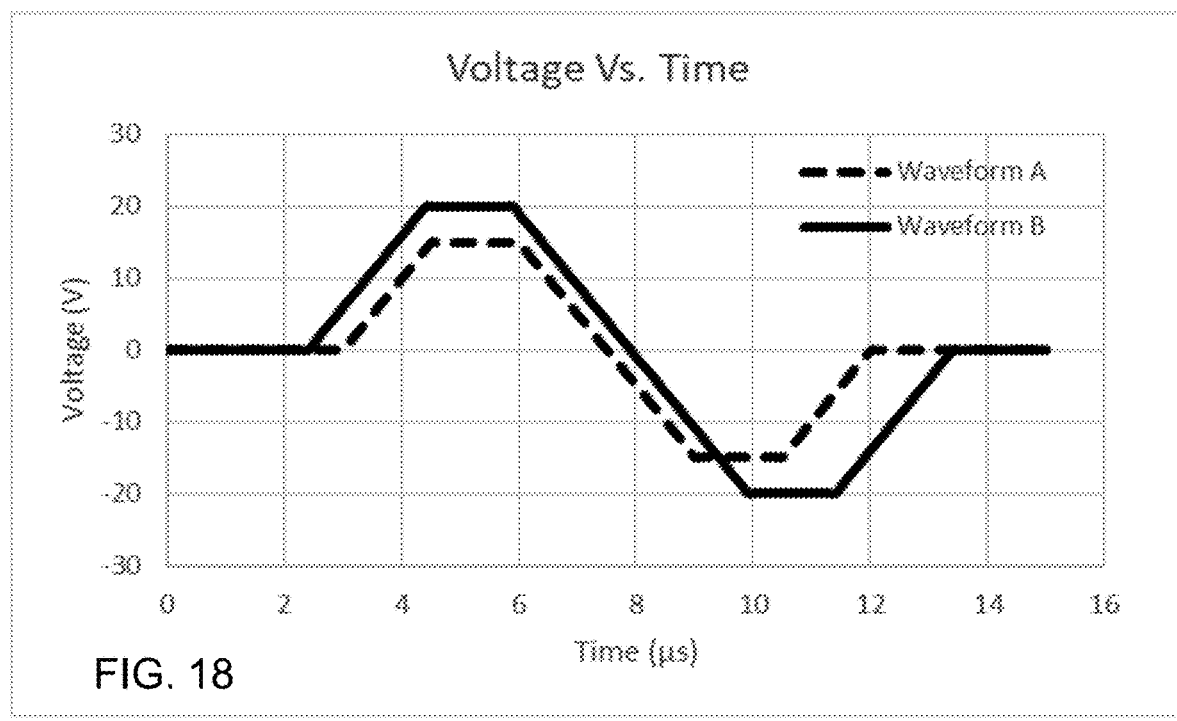
FIG. 18 illustrates an example waveform adjustment to modify drop volume.
Figure 19A:
FIGS. 19A and 19B illustrate example drops of formable material.
Figure 19B:

FIG. 18 illustrates an example waveform adjustment to modify drop volume. In the example waveform adjustment of FIG. 18, the one or more processors 132 adjust the amplitude and the start and stop time of the waveform. In the example, the ramp rate, period, and dwell times may be kept constant. By virtue of the waveform adjustments in FIG. 18, the voltage is increased (step S1703) based on the scaling parameter determined in step S1702. FIGS. 19A and 19B illustrate example drops of formable material produced by the example waveforms of FIG. 18. The drop of formable material shown in FIG. 19A was produced by the waveform A of FIG. 18. The drop of formable material shown in FIG. 19B was produced by the waveform B of FIG. 18. The drop volume of the drop of formable material shown in FIG. 19B is larger than the drop volume of the drop of formable material shown in FIG. 19A.

Thus, by virtue of the method of FIG. 17, the drop volume is adjusted for a group of nozzles of a dispenser by adjusting a waveform for the group of nozzles of the dispenser by changing the voltage of the waveform by a scaling parameter corresponding to the adjustment amount determined in step S1308. That is, the volume of each drop dispensed by the dispenser 122a is increased by virtue of the adjustment.

FIG. 20 illustrates an operational flow of an example method for changing a drop pattern to modify drop volume. In step S2001, the one or more processors 132 obtain a target volume map. The target volume map may include varying volumes across the substrate. For example, to achieve the target thickness of the different steps as indicated in FIG. 11, the target volume map would vary across the substrate according to the respective volumes. The target volume map obtained in step S2001 includes volume targets corresponding to the regions on which the dispenser nozzle group for which the adjustment is being made will dispense formable material.

In step S2002, the one or more processors 132 determine a scaling parameter based on the adjustment amount determined in step S1308 and the target volume map. For example, if the adjustment amount is to increase the volume of the formable material output by 10%, and if the target volume map for a region requested 50 nm thickness for the film, then the scaling parameter would be the increased drop density required for 55 nm thickness.

In step S2003, the one or more processors 132 generate a scaled volume map by applying the scaling parameter determined in step S2002 to the target volume map obtained in step S2001. For example, the one or more processors 132 would generate a new map that would include the increased drop density for the nozzles of dispenser 122a based on a target thickness of 55 nm for the region.

In step S2004, the one or more processors 132 generate a drop pattern based on the scaled volume map generated in step S2003. The drop pattern generated in step S2004 has a higher drop density than, for example, the drop pattern for the nozzles of dispenser 122a used to produce the substrate shown in FIG. 14.

Thus, by virtue of the method of FIG. 20, the drop density is adjusted for a group of nozzles of a dispenser by scaling a desired volume map based on the adjustment amount determined in step S1308 and generating a drop pattern based on the scaled desired volume map. That is, the number of drops dispensed by the dispenser 122a is increased by virtue of the adjustment.

FIG. 21 illustrates an operational flow of an example method for adjusting drop volume. In step S2101, the one or more processors 132 obtain a target volume for the substrate shown in FIG. 14. In step S2102, the one or more processors 132 estimate drop volumes for each group of nozzles of the dispenser 122a and each group of nozzles of the dispenser 122b based on the target volume and respective adjustment amounts corresponding to each group of nozzles. In step S2103, the one or more processors 132 obtain a target volume map. The target volume map may include varying volumes across the substrate. For example, to achieve the target thickness of the different steps as indicated in FIG. 11, the target volume map would vary across the substrate according to the respective volumes. The target volume map obtained in step S2103 includes volume targets corresponding to the regions on which each dispenser nozzle group will dispense formable material. In step S2104, the one or more processors 132 generate a drop pattern based on the drop volumes estimated in step S2102 and the target volume map obtained in step S2103. In an alternative embodiment, the instead of using drop pattern generation software that uses information about the variation in drop volume, the target volume map is scaled based on the drop volume variation and the drop pattern generation software uses the scaled target volume map.

Thus, by virtue of the method of FIG. 21, the drop density is adjusted for each group of nozzles of the dispensers by scaling a desired volume map based on respective adjustment amounts determined for each group of nozzles and generating a drop pattern based on the scaled desired volume map. That is, the number of drops dispensed by the dispenser 122a is increased by virtue of the adjustment.

Figure 22:
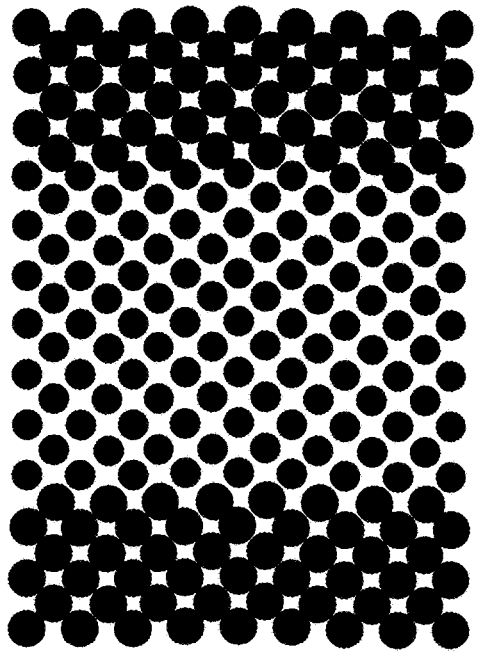
FIGS. 22 to 24 illustrate example drops of formable material.
Figure 23:
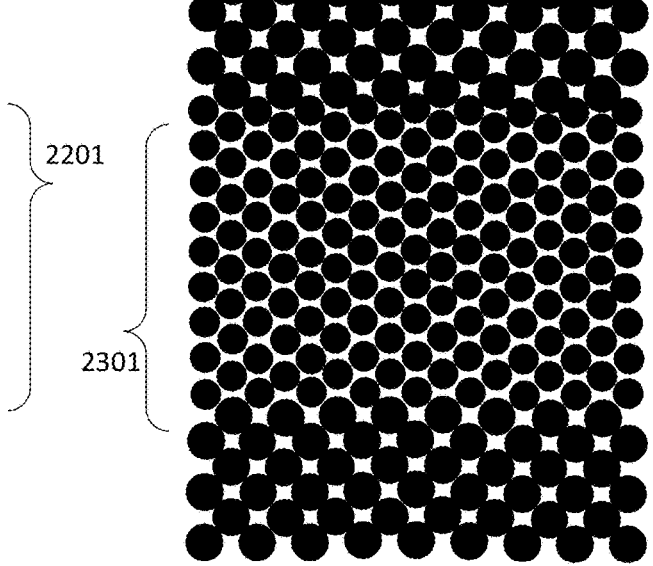
Figure 24:
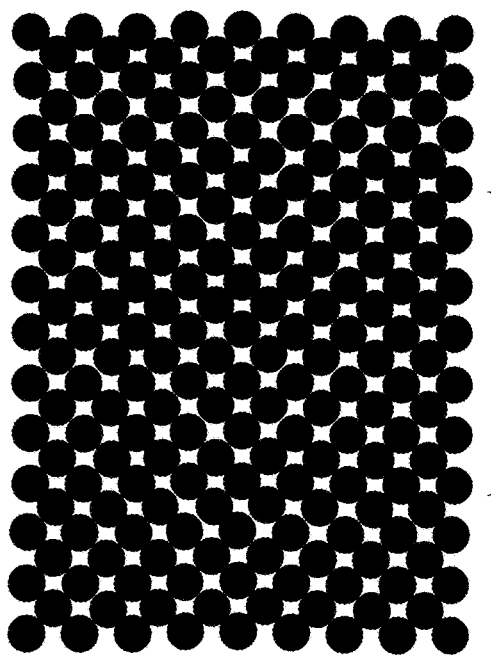

FIGS. 22 to 24 illustrate example drops of formable material. FIG. 22 illustrates the example drops dispensed onto a substrate including drops in region 2201 which have a lower drop volume and lower drop density than the drops of FIG. 22 which are not included among the drops in region 2201. FIG. 23 illustrates drops dispensed onto a substrate including drops in region 2301. The drops in region 2301 have the same drop volume as the drops in region 2201 of FIG. 22. The drops in region 2301 of FIG. 23, however, have a higher drop density than the drops in region 2201 of FIG. 22. The drops in region 2301 of FIG. 23 represent drops dispensed by the dispenser 122a after the dispenser 122a dispensed the drops in region 2201 of FIG. 22. The drops in region 2301 of FIG. 23 are examples of drops dispensed by the dispenser 122a after an adjustment using the adjustment method of FIG. 20 or an adjustment using the adjustment method of FIG. 21. That is, the number of drops dispensed by the dispenser 122a is increased in FIG. 23.

FIG. 24 illustrates drops dispensed onto a substrate including drops in region 2401. The number of drops in region 2401 is the same as the number of drops in region 2201 of FIG. 22. The drops in region 2401 of FIG. 24, however, have a higher volume than the drops in region 2201 of FIG. 22. The drops in region 2401 of FIG. 24 represent drops dispensed by the dispenser 122a after the dispenser 122a dispensed the drops in region 2201 of FIG. 22. The drops in region 2401 of FIG. 24 are examples of drops dispensed by the dispenser 122a after an adjustment using the adjustment method of FIG. 17. That is, the volume of each drop dispensed by the dispenser 122a is increased by virtue of the adjustment.

Figure 25:
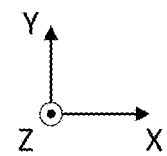
FIG. 25 illustrates an example image of a substrate including a film.
Figure 25:
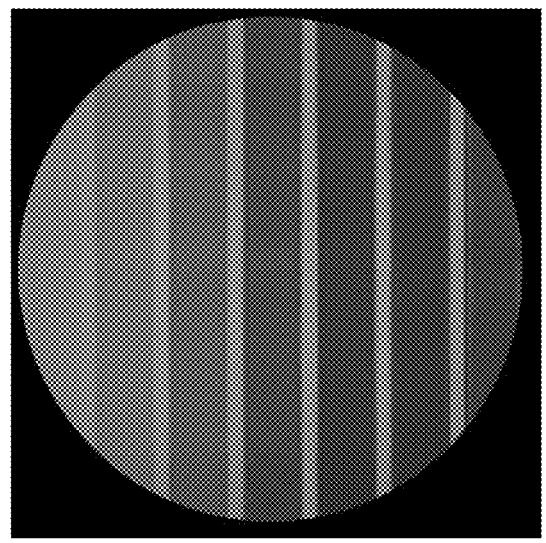

FIG. 25 illustrates an example image of a substrate including a film after an adjustment. For example, the substrate including the film of FIG. 14 was generated by the dispensers 122a and 122b before an adjustment according to step S1309 and FIG. 17, FIG. 20, or FIG. 21. On the other hand, the substrate including the film of FIG. 25 was generated by the dispensers 122a and 122b after an adjustment according to step S1309 and FIG. 17, FIG. 20, or FIG. 21.

Figure 26:
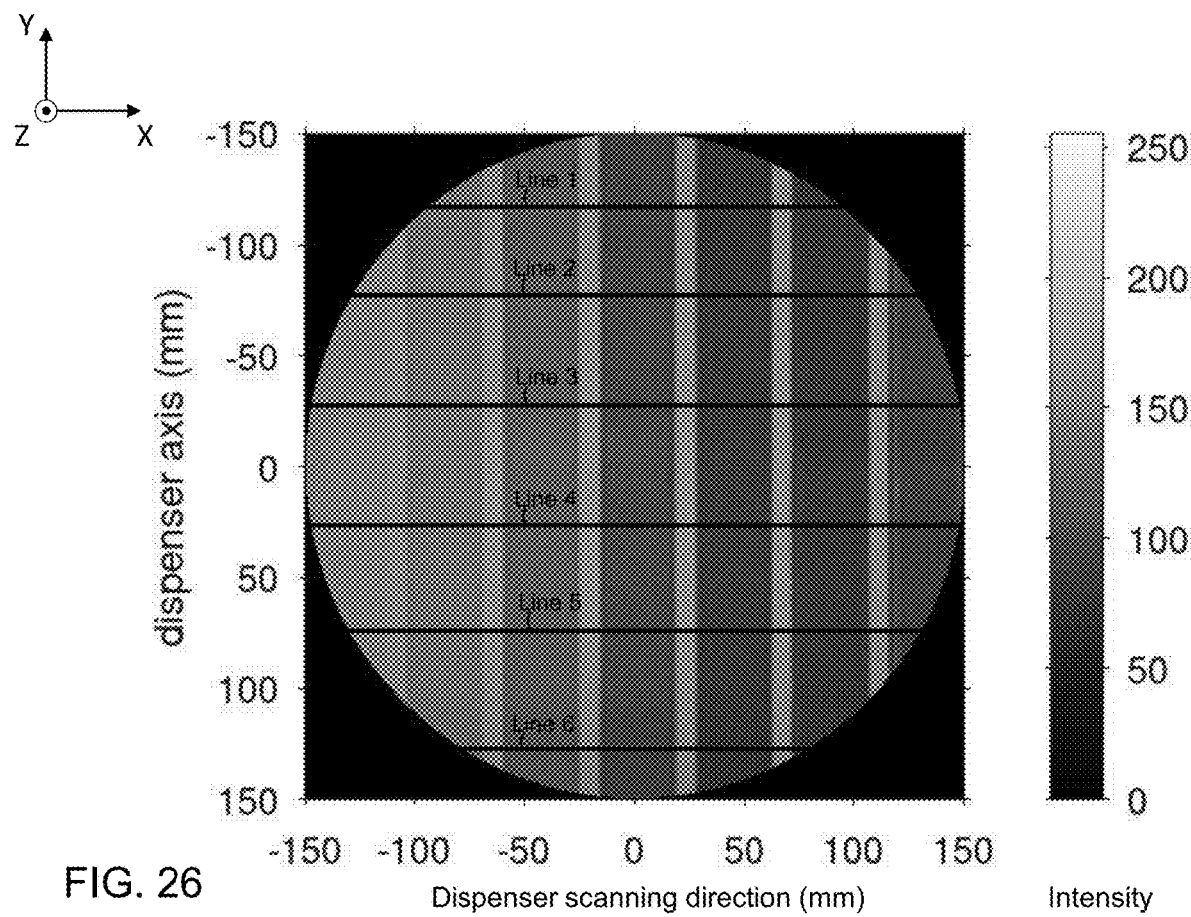
FIG. 26 illustrates an example grayscale image of a substrate including a film.
Figure 27:
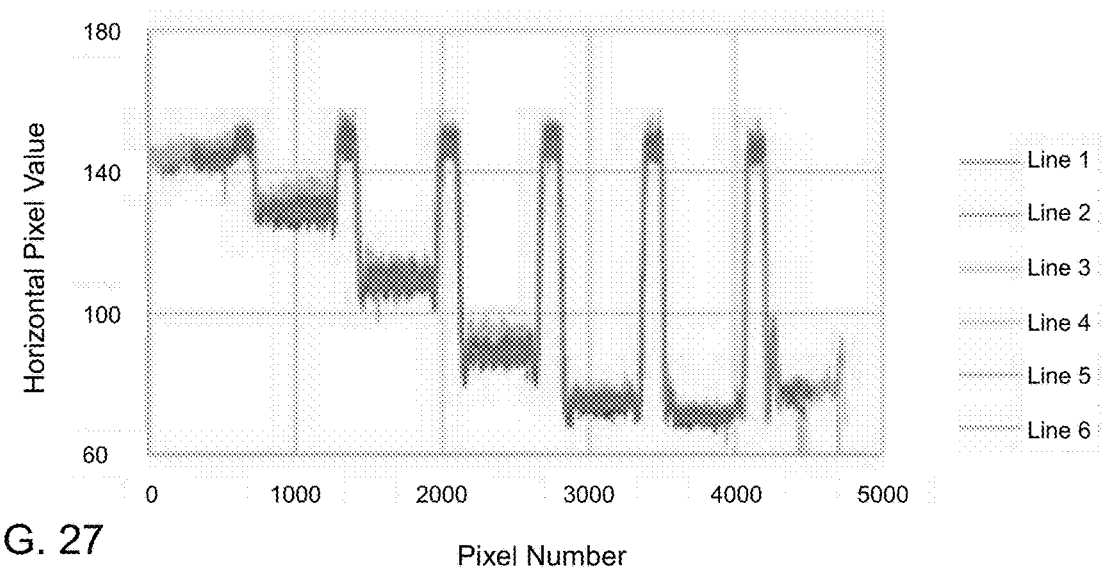
FIG. 27 illustrates an example plot of grayscale pixel values corresponding to respective positions on the image of the substrate of FIG. 26.

FIG. 26 illustrates an example grayscale image of a substrate including a film. FIG. 27 illustrates an example plot of grayscale pixel values corresponding to respective positions on the image of the substrate shown in FIG. 26. A comparison of the example substrate and plot illustrated in FIGS. 14 and 15 with the example substrate and plot illustrated in FIGS. 26 and 27 illustrates the improvement in uniformity of the cured film produced by the adjustments to the dispensers disclosed herein. FIG. 26 illustrates the example grayscale image of the substrate including the film shown in FIG. 25, except that FIG. 26 includes Line 1, Line 2, Line 3, Line 4, Line 5, and Line 6. The Lines 1, 2, 3, 4, 5, 6 in FIG. 26 are positioned in the same vertical (Y) position as the respective Lines 1, 2, 3, 4, 5, 6 in FIG. 14. The Lines 1, 3, 5 correspond to regions of the substrates on which the dispenser 122a deposited formable material. The Lines 2, 4, 6 correspond to regions of the substrate on which the second dispenser 122b deposited formable material. In some embodiments, each of Line 1, Line 3, and Line 5 corresponds to a respective group of nozzles of the dispenser 122a, and each of Line 2, Line 4, and Line 6 corresponds to a respective group of nozzles of the dispenser 122b.

FIG. 27 illustrates an example plot of grayscale pixel values corresponding to respective positions on the image of the substrate of FIG. 26. The one or more processors 132 generate the plot for grayscale intensity values at each X position along Line 1, Line 2, Line 3, Line 4, Line 5, and Line 6. For example, FIG. 27 illustrates the plot of grayscale pixel values corresponding to the respective X positions along Line 1, Line 2, Line 3, Line 4, Line 5, and Line 6 on the image of the substrate of FIG. 26.

Comparing the plot of FIG. 15 with the plot of FIG. 27 demonstrates the effectiveness of grayscale image processing to gauge the uniformity of the overburden thickness variation. The image and plot of FIGS. 14 and 15 show the uncalibrated dispensers with overburden thickness variation and the line profile in grayscale intensity. The image and plot of FIGS. 26 and 27, on the other hand, shows closely matched dispensers with almost identical line profiles. Thus, but virtue of features of the present disclosure, an overburden thickness difference can be measured by capturing an image of a substrate using the camera 136 and using the image's grayscale. The results can be used to finetune process parameters (such as drop pattern and/or the driving voltage for each dispenser to matching conditions), and to track process stability over time by monitoring each processed wafer.

Figure 28:
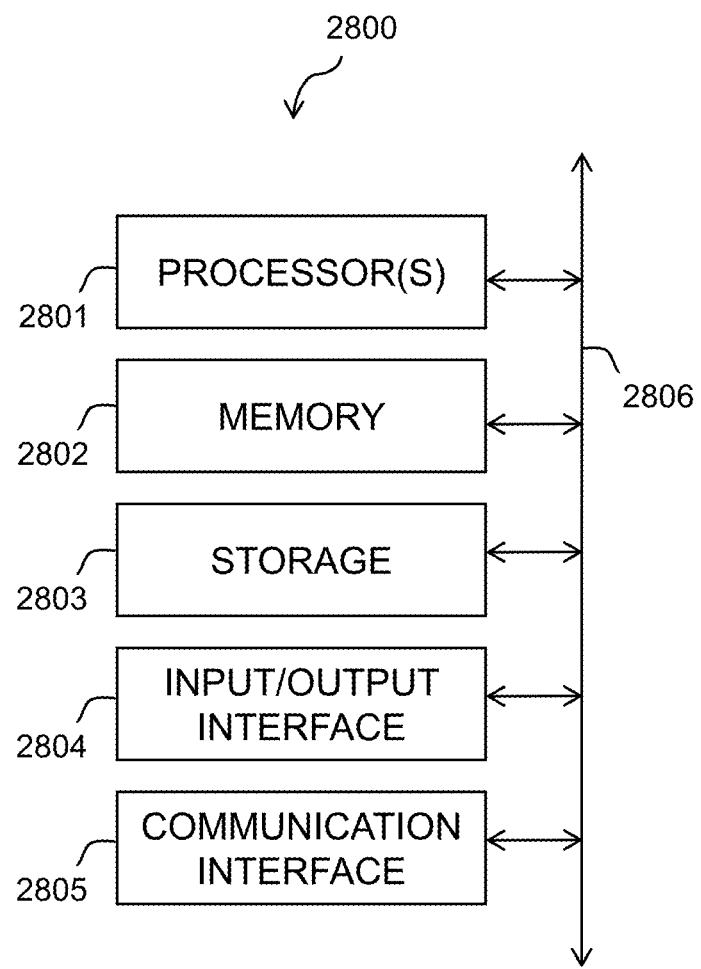
FIG. 28 illustrates an example computing system.

FIG. 28 illustrates an example computing system 2800. According to various embodiments, all or a portion of the description of the computing system 2800 is applicable to all or a portion of one or more of the nanoimprint lithography system 100, the one or more processors 132, and the lithography-control device 140. In some embodiments, the computing system 2800 provides functionality described herein. In some embodiments, software running on the computing system 2800 performs one or more operations described herein.

The term computing system as used herein includes but is not limited to one or more software modules, one or more hardware modules, one or more firmware modules, or combinations thereof, that work together to perform operations on electronic data. The physical layout of the modules may vary. A computing system may include multiple computing devices coupled via a network. A computing system may include a single computing device where internal modules (such as a memory and processor) work together to perform operations on electronic data. Also, the term resource as used herein includes but is not limited to an object that can be processed at a computing system. A resource can be a portion of executable instructions or data.

In some embodiments, the computing system 2800 performs one or more steps of one or more methods described or illustrated herein. In some embodiments, the computing system 2800 provides functionality described or illustrated herein. In some embodiments, software running on the computing system 2800 performs one or more steps of one or more methods described or illustrated herein or provides functionality described or illustrated herein. Some embodiments include one or more portions of the computing system 2800.

The computing system 2800 includes one or more processor(s) 2801, memory 2802, storage 2803, an input/output (I/O) interface 2804, a communication interface 2805, and a bus 2806. The computing system 2800 may take any suitable physical form. By way of example, the computing system 2800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, PDA, a server, a tablet computer system, or a combination of two or more of these.

The processor(s) 2801 include hardware for executing instructions, such as those making up a computer program. The processor(s) 2801 may retrieve the instructions from the memory 2802, the storage 2803, an internal register, or an internal cache. The processor(s) 2801 then decode and execute the instructions. Then, the processor(s) 2801 write one or more results to the memory 2802, the storage 2803, the internal register, or the internal cache. The processor(s) 2801 may provide the processing capability to execute the operating system, programs, user and application interfaces, and any other functions of the computing system 2800.

The processor(s) 2801 may include a central processing unit (CPU), one or more general-purpose microprocessor(s), application-specific microprocessor(s), and/or special purpose microprocessor(s), or some combination of such processing components. The processor(s) 2801 may include one or more graphics processors, video processors, audio processors and/or related chip sets.

In some embodiments, the memory 2802 includes main memory for storing instructions for the processor(s) 2801 to execute or data for the processor(s) 2801 to operate on. By way of example, the computing system 2800 may load instructions from the storage 2803 or another source to the memory 2802. During or after execution of the instructions, the processor(s) 2801 may write one or more results (which may be intermediate or final results) to the memory 2802. One or more memory buses (which may each include an address bus and a data bus) may couple the processor(s) 2801 to the memory 2802. One or more memory management units (MMUs) may reside between the processor(s) 2801 and the memory 2802 and facilitate accesses to the memory 2802 requested by the processor(s) 2801. The memory 2802 may include one or more memories. The memory 2802 may be random access memory (RAM).

The storage 2803 stores data and/or instructions. As an example and not by way of limitation, the storage 2803 may include a hard disk drive, a floppy disk drive, flash memory, an optical disc, a magneto-optical disc, magnetic tape, or a Universal Serial Bus (USB) drive or a combination of two or more of these. In some embodiments, the storage 2803 is a removable medium. In some embodiments, the storage 2803 is a fixed medium. In some embodiments, the storage 2803 is internal to the computing system 2800. In some embodiments, the storage 2803 is external to the computing system 2800. In some embodiments, the storage 2803 is non-volatile, solid-state memory. In some embodiments, the storage 2803 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. The storage 2803 may include one or more memory devices. One or more program modules stored in the storage 2803 may be configured to cause various operations and processes described herein to be executed. The storage 2803 may store application data, program modules and other information. In some embodiments, application(s) reside on the storage 2803 and execute on the computing system 2800. One or more program modules stored in the storage 2803 are configured to cause various operations and processes described herein to be executed. For example, programs of one or more application (s) may include instructions that, when executed by one or more processors, cause the one or more processors to perform one or more operations described with respect to one or more of FIG. 3, FIG. 7, FIG. 13, FIG. 17, FIG. 20, and FIG. 21.

The I/O interface 2804 includes hardware, software, or both providing one or more interfaces for communication between the computing system 2800 and one or more I/O devices. The computing system 2800 may include one or more of these I/O devices, where appropriate. One or more of these I/O devices may enable communication between a person and the computing system 2800. As an example and not by way of limitation, an I/O device may include a light source, a keyboard, keypad, microphone, monitor, mouse, speaker, still camera, stylus, tablet, touch screen, trackball, video camera, another suitable I/O device or a combination of two or more of these. An I/O device may include one or more sensors. In some embodiments, the I/O interface 2804 includes one or more device or software drivers enabling the processor(s) 2801 to drive one or more of these I/O devices. The I/O interface 2804 may include one or more I/O interfaces.

The communication interface 2805 includes hardware, software, or both providing one or more interfaces for communication (such as, for example, packet-based communication) between the computing system 2800 and one or more other computing systems or one or more networks. As an example and not by way of limitation, the communication interface 2805 may include a network interface card (NIC) or a network controller for communicating with an Ethernet or other wire-based network or a wireless NIC (WNIC) or wireless adapter for communicating with a wireless network, such as a WI-FI network. This disclosure contemplates any suitable network and any suitable communication interface 2805 for it. As an example and not by way of limitation, the computing system 2800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, the computing system 2800 may communicate with a wireless PAN (WPAN) (such as, for example, a Bluetooth WPAN or an ultra wideband (UWB) network), a WI-FI network, a WI-MAX network, a cellular telephone network (such as, for example, a Global System for Mobile Communications (GSM) network), or other suitable wireless network or a combination of two or more of these. The computing system 2800 may include any suitable communication interface 2805 for any of these networks, where appropriate. The communication interface 2805 may include one or more communication interfaces 2805.

The bus 2806 interconnects various components of the computing system 2800 thereby enabling the transmission of data and execution of various processes. The bus 2806 may include one or more types of bus structures including a memory bus or memory controller, a peripheral bus, and a local bus using any of a variety of bus architectures.

The above description serves to explain principles of the disclosure; but the disclosure should not be limited to the examples described above. For example, the order and/or timing of some of the various operations may vary from the examples given above without departing from the scope of the disclosure. Other variations from the examples given above may also exist without departing from the scope of the disclosure. For example, various features of the illustrated examples could be modified, rearranged, or removed, or one or more features could be added without departing from the scope of the disclosure.

The scope of the present disclosure includes a computer-readable medium storing instructions that, when executed by one or more processors, cause the one or more processors to perform one or more embodiments of the disclosure described herein. Examples of a computer-readable medium include a hard disk, a floppy disk, a magneto-optical disk (MO), a compact-disk read-only memory (CD-ROM), a compact disk recordable (CD-R), a CD-Rewritable (CD-RW), a digital versatile disk ROM (DVD-ROM), a DVD-RAM, a DVD-RW, a DVD+RW, magnetic tape, a nonvolatile memory card, and a ROM. Computer-executable instructions can also be supplied to the computer-readable storage medium by being downloaded via a network.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Thus, the scope of the claims is not limited to the above-described embodiments and includes various modifications and equivalent arrangements.

What is claimed is:

1. A method comprising:
   obtaining an image of a substrate including a film, the film formed on the substrate by curing formable material deposited on the substrate by a first dispenser and a second dispenser, the first dispenser depositing drops of the formable material on a first portion of the substrate from a group of nozzles of the first dispenser based on a target volume, the second dispenser depositing drops of the formable material on a second portion of the substrate from a group of nozzles of the second dispenser based on the target volume, the second portion of the substrate different from the first portion of the substrate;
   obtaining intensity information for pixels of the image of the substrate, the intensity information including first intensity data corresponding to the first portion of the substrate and second intensity data corresponding to the second portion of the substrate;
   determining a difference between first intensity values corresponding to a region of the substrate and second intensity values corresponding to the region of the substrate, the first intensity values comprising intensity values of the first intensity data, the second intensity values comprising intensity values of the second intensity data, wherein the region of the substrate is associated with a target thickness for the film on the substrate;
   determining that the difference between the first intensity values and the second intensity values exceeds a threshold;
   determining a first adjustment amount for the group of nozzles of the first dispenser based on the first intensity values and a second adjustment amount for the group of nozzles of the second dispenser based on the second intensity values; and
   adjusting one or both of a drop volume and a drop density for the group of nozzles of the first dispenser based on the first adjustment amount and one or both of a drop volume and a drop density for the group of nozzles of the second dispenser based on the second adjustment amount.

2. The method of claim 1, wherein the determining the first adjustment amount for the group of nozzles of the first dispenser includes:
determining a first estimated thickness of the film at the region of the substrate based on the first intensity values; and
determining the first adjustment amount based on the target volume and the first estimated thickness of the film at the region of the substrate, and
wherein the determining the second adjustment amount for the group of nozzles of the second dispenser includes:
determining a second estimated thickness of the film at the region of the substrate based on the second intensity values; and
determining the second adjustment amount based on the target volume and the second estimated thickness of the film at the region of the substrate.

3. The method of claim 1, wherein the adjusting the drop volume for the group of nozzles of the first dispenser includes adjusting a first waveform for the group of nozzles of the first dispenser by changing a voltage of the first waveform by a first scaling parameter corresponding to the first adjustment amount, and
wherein the adjusting the drop volume for the group of nozzles of the second dispenser includes adjusting a second waveform for the group of nozzles of the second dispenser by changing a voltage of the second waveform by a second scaling parameter corresponding to the second adjustment amount.

4. The method of claim 1, wherein the adjusting the drop density for the group of nozzles of the first dispenser and the group of nozzles of the second dispenser includes:
obtaining a desired volume map that varies across the wafer;
generating a new map by scaling the desired volume map based on the first adjustment amount for the group of nozzles of the first dispenser and the second adjustment amount for the group of nozzles of the second dispenser; and
generating a drop pattern based on the new map.

5. The method of claim 1, wherein the adjusting the drop density for the group of nozzles of the first dispenser and the group of nozzles of the second dispenser includes:
estimating a plurality of drop volumes dispensed by the first dispenser based on at least the first adjustment amount for the group of nozzles of the first dispenser;
estimating a plurality of drop volumes dispensed by the second dispenser based on at least the second adjustment amount for the group of nozzles of the second dispenser;
obtaining a desired volume map that varies across the wafer; and
generating a drop pattern based on the plurality of drop volumes dispensed by the first dispenser, the plurality of drop volumes dispensed by the second dispenser, and the desired volume map.

6. The method of claim 1, further comprising:
obtaining an image of a second substrate including a second film;
generating a plot of intensity values of pixels of the image of the second substrate;
applying mask data to regions of the plot;
calculating a respective average intensity value for each of the regions to which the mask data has been applied;
obtaining thickness measurement data for the second film on the second substrate; and
generating a function by correlating the average intensity values with the thickness measurement data,
wherein the first adjustment amount and the second adjustment amount are determined based on the function.

7. The method of claim 1, further comprising:
obtaining a set of relationship values, the set of relationship values indicating relationships between grayscale intensity values and corresponding film thickness values, the grayscale intensity values based on an image of a second film on a second substrate, the film thickness values based on thickness measurements for the second film on the second substrate,
wherein the first adjustment amount for the group of nozzles of the first dispenser and the second adjustment amount for the group of nozzles of the second dispenser are determined based on the set of relationship values.

8. The method of claim 7, further comprising:
determining a first estimated thickness of the film at the region of the substrate based on the set of relationship values and the first intensity values, the set of relationship values indicating a corresponding relationship between the first intensity values and the first estimated thickness;
determining the first adjustment amount based on the first estimated thickness;
determining a second estimated thickness of the film at the region of the substrate based on the set of relationship values and the second intensity values, the set of relationship values indicating a corresponding relationship between the second intensity values and the second estimated thickness; and
determining the second adjustment amount based on the second estimated thickness.

9. The method of claim 1, further comprising:
depositing the formable material on a second substrate according to a drop pattern that has been calibrated based on the adjusting of the one or both of the drop volume and the drop density for the group of nozzles of the first dispenser based on the first adjustment amount and the one or both of the drop volume and the drop density for the group of nozzles of the second dispenser based on the second adjustment amount;
bringing a shaping surface of a superstrate or a template into contact with the formable material that has been deposited on the second substrate; and
curing the formable material that has been deposited on the second substrate while the shaping surface is in contact with the formable material.

10. The method of claim 1, further comprising:
processing the second substrate with the cured formable material to form a plurality of articles by subjecting the substrate with the cured formable material with one or more of a plurality of known semiconductor procedures and processes for article fabrication.

11. A system comprising:
one or more computer-readable media; and
one or more processors in communication with the one or more computer-readable media, wherein the one or more processors and the one or more computer-readable media are configured to cause the system to perform operations comprising:

obtaining an image of a substrate including a film, the film formed on the substrate by curing formable material deposited on the substrate by a first dispenser and a second dispenser, the first dispenser depositing drops of the formable material on a first portion of the substrate from a group of nozzles of the first dispenser based on a target volume, the second dispenser depositing drops of the formable material on a second portion of the substrate from a group of nozzles of the second dispenser based on the target volume, the second portion of the substrate different from the first portion of the substrate;

obtaining intensity information for pixels of the image of the substrate, the intensity information including first intensity data corresponding to the first portion of the substrate and second intensity data corresponding to the second portion of the substrate;

determining a difference between first intensity values corresponding to a region of the substrate and second intensity values corresponding to the region of the substrate, the first intensity values comprising intensity values of the first intensity data, the second intensity values comprising intensity values of the second intensity data, wherein the region of the substrate is associated with a target thickness for the film on the substrate;

determining that the difference between the first intensity values and the second intensity values exceeds a threshold;

determining a first adjustment amount for the group of nozzles of the first dispenser based on the first intensity values and a second adjustment amount for the group of nozzles of the second dispenser based on the second intensity values; and adjusting one or both of a drop volume and a drop density for the group of nozzles of the first dispenser based on the first adjustment amount and one or both of a drop volume and a drop density for the group of nozzles of the second dispenser based on the second adjustment amount.

12. The system of claim 11, wherein the determining the first adjustment amount for the group of nozzles of the first dispenser includes:
determining a first estimated thickness of the film at the region of the substrate based on the first intensity values; and
determining the first adjustment amount based on the target volume and the first estimated thickness of the film at the region of the substrate, and
wherein the determining the second adjustment amount for the group of nozzles of the second dispenser includes:
determining a second estimated thickness of the film at the region of the substrate based on the second intensity values; and
determining the second adjustment amount based on the target volume and the second estimated thickness of the film at the region of the substrate.

13. The system of claim 11, wherein the adjusting the drop volume for the group of nozzles of the first dispenser includes adjusting a first waveform for the group of nozzles of the first dispenser by changing a voltage of the first waveform by a first scaling parameter corresponding to the first adjustment amount, and
wherein the adjusting the drop volume for the group of nozzles of the second dispenser includes adjusting a second waveform for the group of nozzles of the second dispenser by changing a voltage of the second waveform by a second scaling parameter corresponding to the second adjustment amount.

14. The system of claim 11, wherein the adjusting the drop density for the group of nozzles of the first dispenser and the group of nozzles of the second dispenser includes:
obtaining a desired volume map that varies across the wafer;
generating a new map by scaling the desired volume map based on the first adjustment amount for the group of nozzles of the first dispenser and the second adjustment amount for the group of nozzles of the second dispenser; and
generating a drop pattern based on the new map.

15. The system of claim 11, wherein the adjusting the drop density for the group of nozzles of the first dispenser and the group of nozzles of the second dispenser includes:
estimating a plurality of drop volumes dispensed by the first dispenser based on at least the first adjustment amount for the group of nozzles of the first dispenser;
estimating a plurality of drop volumes dispensed by the second dispenser based on at least the second adjustment amount for the group of nozzles of the second dispenser;
obtaining a desired volume map that varies across the wafer; and
generating a drop pattern based on the plurality of drop volumes dispensed by the first dispenser, the plurality of drop volumes dispensed by the second dispenser, and the desired volume map.

16. The system of claim 11, wherein the one or more processors and the one or more computer-readable media are further configured to cause the system to perform operations comprising:
obtaining an image of a second substrate including a second film;
generating a plot of intensity values of pixels of the image of the second substrate;
applying mask data to regions of the plot;
calculating a respective average intensity value for each of the regions to which the mask data has been applied;
obtaining thickness measurement data for the second film on the second substrate; and
generating a function by correlating the average intensity values with the thickness measurement data,
wherein the first adjustment amount and the second adjustment amount are determined based on the function.

17. The system of claim 11, wherein the one or more processors and the one or more computer-readable media are further configured to cause the system to perform operations comprising:
obtaining a set of relationship values, the set of relationship values indicating relationships between grayscale intensity values and corresponding film thickness values, the grayscale intensity values based on an image of a second film on a second substrate, the film thickness values based on thickness measurements for the second film on the second substrate,
wherein the first adjustment amount for the group of nozzles of the first dispenser and the second adjustment amount for the group of nozzles of the second dispenser are determined based on the set of relationship values.

18. The system of claim 17, wherein the one or more processors and the one or more computer-readable media are further configured to cause the system to perform operations comprising:

determining a first estimated thickness of the film at the region of the substrate based on the set of relationship values and the first intensity values, the set of relationship values indicating a corresponding relationship between the first intensity values and the first estimated thickness;

determining the first adjustment amount based on the first estimated thickness;

determining a second estimated thickness of the film at the region of the substrate based on the set of relationship values and the second intensity values, the set of relationship values indicating a corresponding relationship between the second intensity values and the second estimated thickness; and determining the second adjustment amount based on the second estimated thickness.

19. The system of claim 11, wherein the one or more processors and the one or more computer-readable media are further configured to cause the system to perform operations comprising:

depositing the formable material on the substrate according to a drop pattern;

bringing a superstrate into contact with the formable material that has been deposited on the substrate; and curing the formable material that has been deposited on the substrate while the superstrate is in contact with the formable material.

\* \* \* \* \*